US010304700B2

(12) United States Patent
Liu et al.

(10) Patent No.: US 10,304,700 B2
(45) Date of Patent: May 28, 2019

(54) SEMICONDUCTOR DEVICE AND METHOD

(71) Applicant: Taiwan Semiconductor Manufacturing Company, Ltd., Hsin-Chu (TW)

(72) Inventors: Zi-Jheng Liu, Taoyuan (TW); Yu-Hsiang Hu, Hsin-Chu (TW); Jo-Lin Lan, Kaohsiung (TW); Shih-Hao Liao, New Taipei (TW); Chen-Cheng Kuo, Chu-Pei (TW); Hung-Jui Kuo, Hsin-Chu (TW); Chung-Shi Liu, Hsin-Chu (TW); Chen-Hua Yu, Hsin-Chu (TW); Meng-Wei Chou, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/170,487

(22) Filed: Jun. 1, 2016

(65) Prior Publication Data
US 2017/0110421 A1  Apr. 20, 2017

Related U.S. Application Data

(60) Provisional application No. 62/243,894, filed on Oct. 20, 2015.

(51) Int. Cl.
H01L 21/56 (2006.01)
H01L 23/00 (2006.01)
(Continued)

(52) U.S. Cl.
CPC ............ *H01L 21/561* (2013.01); *H01L 24/19* (2013.01); *H01L 24/20* (2013.01); *H01L 24/97* (2013.01);
(Continued)

(58) Field of Classification Search
CPC ......... H01L 24/02; H01L 24/03; H01L 24/13; H01L 24/05
See application file for complete search history.

(56) References Cited

U.S. PATENT DOCUMENTS 4,643,910 A    2/1987  Foutz
5,122,440 A *  6/1992  Chien ................. G03F 7/70458
                                                     430/313
(Continued)

FOREIGN PATENT DOCUMENTS

JP    2004095836 A    3/2004
JP    2005175317 A    6/2005
(Continued)

OTHER PUBLICATIONS

Hubbard, R.L., et al. "Low Temperature Curing of Polyimide Wafer Coatings." Low Temperature Curing of Polyimide Wafer Coatings—IEEE Conference Publication, Electronics Manufacturing Technology Symposium, 2004. IEEE/CPMT/SEMI 29th International , Jul. 14, 2004, ieeexplore.ieee.org/document/1321649/.*

*Primary Examiner* — Eliseo Ramos Feliciano
*Assistant Examiner* — Christina A Sylvia
(74) *Attorney, Agent, or Firm* — Slater Matsil, LLP

(57) ABSTRACT

A semiconductor device and method that comprise a first dielectric layer over a encapsulant that encapsulates a via and a semiconductor die is provided. A redistribution layer is over the first dielectric layer, and a second dielectric layer is over the redistribution layer, and the second dielectric layer comprises a low-temperature polyimide material.

24 Claims, 16 Drawing Sheets

(51) Int. Cl.
*H01L 25/10* (2006.01)
*H01L 25/00* (2006.01)

(52) U.S. Cl.
CPC ............ *H01L 25/105* (2013.01); *H01L 25/50* (2013.01); *H01L 21/568* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | | |
|---|---|---|---|
| 6,955,984 | B2 | 10/2005 | Wan et al. |
| 8,361,842 | B2* | 1/2013 | Yu .................. H01L 21/561 |
| | | | 257/E21.499 |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,846,548 | B2 | 9/2014 | Tu et al. |
| 8,877,554 | B2 | 11/2014 | Tsai et al. |
| 2005/0127512 | A1* | 6/2005 | Yamagata ........... H01L 23/3114 |
| | | | 257/758 |
| 2005/0250255 | A1* | 11/2005 | Chen ................... H01L 21/312 |
| | | | 438/127 |
| 2009/0140442 | A1 | 6/2009 | Lin |
| 2010/0244208 | A1* | 9/2010 | Pagaila ................. H01L 21/568 |
| | | | 257/659 |
| 2011/0091811 | A1* | 4/2011 | Song ...................... C09J 7/0203 |
| | | | 430/271.1 |
| 2011/0121435 | A1* | 5/2011 | Mitsukura .......... C08G 73/1042 |
| | | | 257/632 |
| 2011/0198762 | A1 | 8/2011 | Scanlan |
| 2011/0291288 | A1 | 12/2011 | Wu et al. |
| 2012/0187584 | A1 | 7/2012 | Lin et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0183718 | A1 | 7/2014 | Han et al. |
| 2014/0203429 | A1 | 7/2014 | Yu et al. |
| 2014/0225222 | A1 | 8/2014 | Yu et al. |
| 2014/0252646 | A1* | 9/2014 | Hung ................... H01L 23/481 |
| | | | 257/774 |
| 2014/0264839 | A1 | 9/2014 | Tsai et al. |
| 2014/0264930 | A1 | 9/2014 | Yu et al. |
| 2014/0339696 | A1 | 11/2014 | Yu et al. |
| 2014/0367160 | A1 | 12/2014 | Yu et al. |
| 2015/0108635 | A1* | 4/2015 | Liang ..................... H01L 28/10 |
| | | | 257/737 |
| 2015/0200166 | A1* | 7/2015 | Kono ..................... H01L 24/03 |
| | | | 257/529 |
| 2015/0270247 | A1 | 9/2015 | Chen et al. |
| 2015/0279776 | A1 | 10/2015 | Hu et al. |
| 2015/0371936 | A1* | 12/2015 | Chen ................ H01L 23/49822 |
| | | | 257/774 |

FOREIGN PATENT DOCUMENTS

| | | |
|---|---|---|
| JP | 2015135869 A | 7/2015 |
| KR | 20140089299 A | 7/2014 |
| TW | 200926312 A | 6/2009 |
| TW | 201428843 A | 7/2014 |
| TW | 201428866 A | 7/2014 |
| TW | 201537679 A | 10/2015 |

\* cited by examiner

| Structure | | | PM1/RDL1/PM2 | | | | | |
|---|---|---|---|---|---|---|---|---|
| PM1 | PBO 8930 Control Leg | LT-PI | LT-PI | LT-PI | LT-PI | LT-PI | LT-PI | LT-PI |
| UBM | 1.20% | 1.20% | 1.20% | 1.20% | 1.20% | 1.20% | 1.20% | 1.20% |
| RDL1 descum | BGMA | BGMA | BGMA | BGMA | BGMA | BGMA | BGMA | BGMA |
| PM2 | 8930 | LT-PI | LT-PI | LT-PI | LT-PI | LT-PI | LT-PI | LT-PI |
| PDB | NO | NO | 140C/2min | 150C/2min | 130C/2min | 110C/2min | 90C/2min | 70C/2min |
| Stud Pull | 5 ea. | 5 ea. | 5 ea. | 5 ea. | 5 ea. | 5 ea. | 5 ea. | 5 ea. |
| 1 | 641 | 649 | 782 | 788 | 754 | 774 | 783 | 691 |
| 2 | 653 | 652 | 755 | 722 | 721 | 740 | 767 | 693 |
| 3 | 643 | 709 | 767 | 739 | 795 | 698 | 663 | 686 |
| 4 | 628 | 667 | 816 | 720 | 702 | 714 | 682 | 679 |
| 5 | 651 | 722 | 797 | 750 | 733 | 751 | 665 | 761 |
| Average/STD dev. | 643 | 680 | 759 | 744 | 741 | 735 | 712 | 702 |
| STD dev | 10 | 47 | 28 | 35 | 45 | 46 | 67 | 57 |
| Max | 653 | 722 | 816 | 788 | 795 | 774 | 783 | 761 |
| Min | 628 | 649 | 755 | 720 | 702 | 698 | 663 | 679 |
| Max-Min | 25 | 73 | 61 | 68 | 93 | 76 | 120 | 82 |

Figure 7B

SEMICONDUCTOR DEVICE AND METHOD

PRIORITY CLAIM AND CROSS-REFERENCE

This application claims priority to and the benefit of U.S. Provisional Application No. 62/243,894, filed on Oct. 20, 2015, entitled "Integrated Fan Out Structure and Method," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7B illustrate a bonding of a package in accordance with some embodiments.

DETAILED DESCRIPTION

Figure 1:
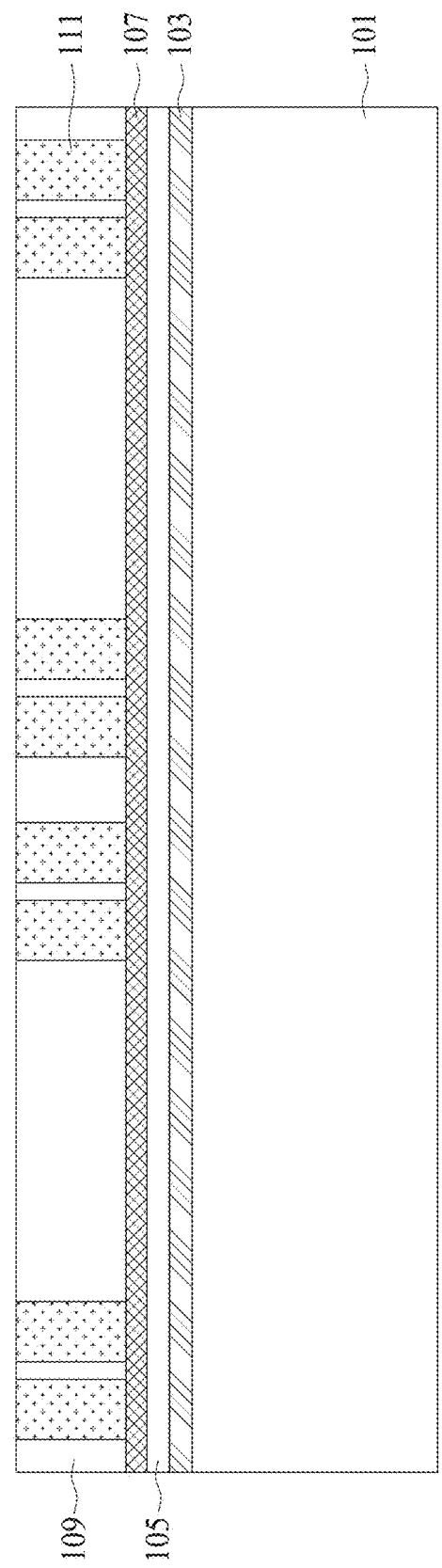
FIG. 1 illustrates a formation of vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be a positive tone material such as polybenzoxazole (PBO, such as the material HD8820), although any suitable material, such as polyimide or a polyimide derivative, may also be utilized. The polymer layer 105 may be placed using, e.g., a spin-coating process to a thickness of between about 0.5 μm and about 10 μm, such as about 5 μm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
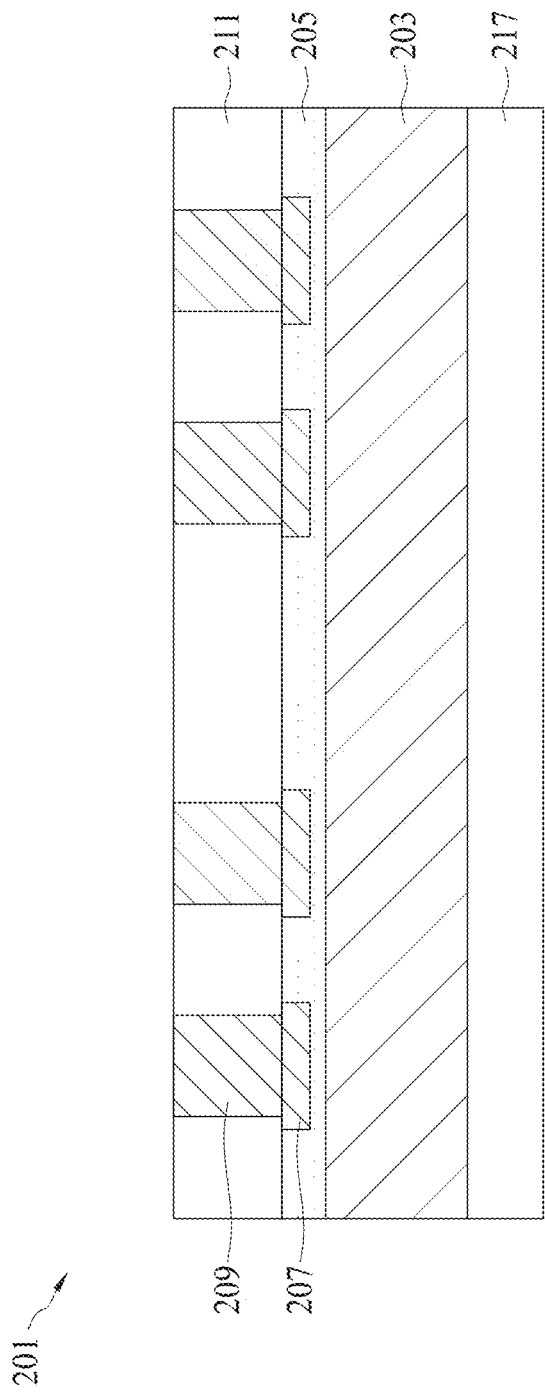
FIG. 2 illustrates a first semiconductor device in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 μm and about 4 μm, such as about 1.45 μm.

The first passivation layer 211 may be formed on the first substrate 203 over the first metallization layers 205 and the first contact pads 207. The first passivation layer 211 may be made of one or more suitable dielectric materials such as polybenzoxazole (PBO), although any suitable material, such as polyimide or a polyimide derivative, may alternatively be utilized. The first passivation layer 211 may be placed using, e.g., a spin-coating process to a thickness of between about 5 µm and about 25 µm, such as about 7 µm, although any suitable method and thickness may alternatively be used The first external connectors 209 may be formed to provide conductive regions for contact between the first contact pads 207 and, e.g., a first redistribution layer 505 (not illustrated in FIG. 2 but illustrated and described below with respect to FIG. 5B). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layers 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A die attach film (DAF) 217 may be placed on an opposite side of the first substrate 203 in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
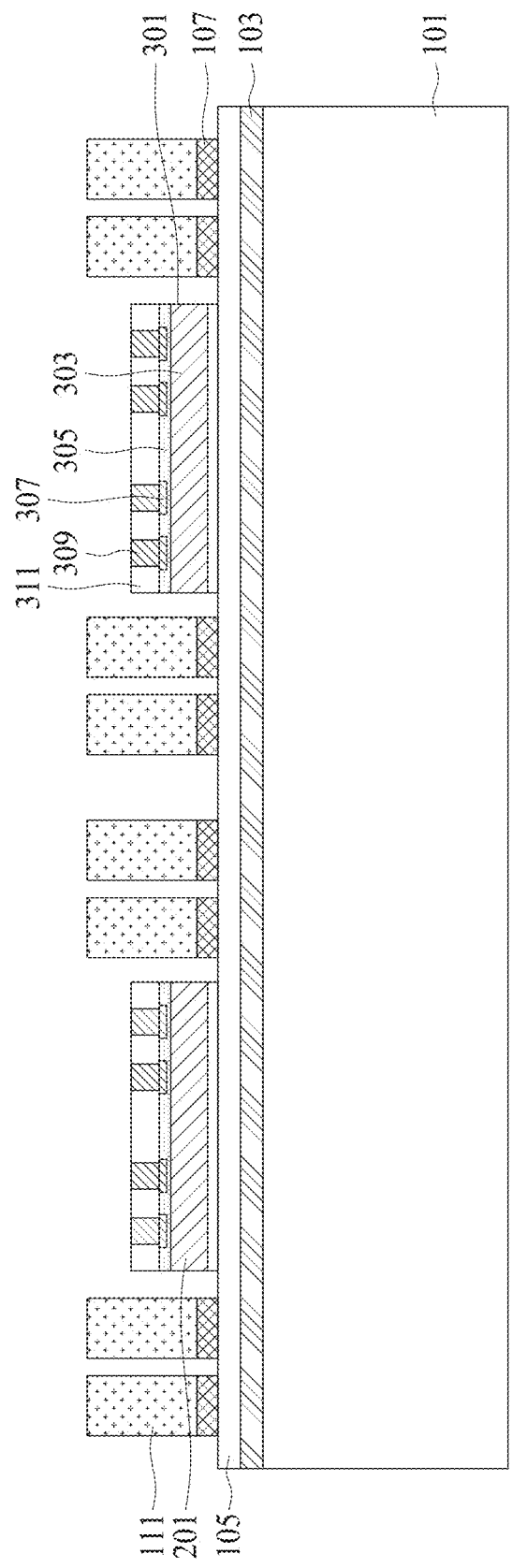
FIG. 3 illustrates a placement of the first semiconductor device and a second semiconductor device in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may also be utilized.

Figure 4:
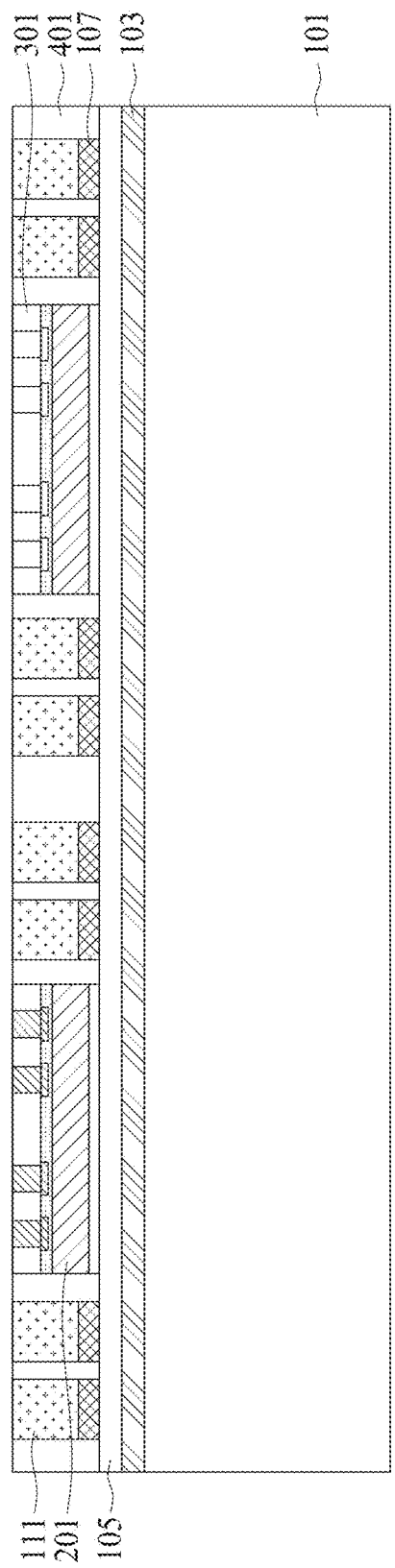
FIG. 4 illustrates an encapsulation of the vias, the first semiconductor device, and the second semiconductor device in accordance with some embodiments.

FIG. 4 illustrates an encapsulation of the vias 111, the first semiconductor device 201 and the second semiconductor device 301. The encapsulation may be performed in a molding device (not illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the first semiconductor device 201, and the second semiconductor device 301.

During the encapsulation process the top molding portion may be placed adjacent to the bottom molding portion, thereby enclosing the first carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Figure 5A:
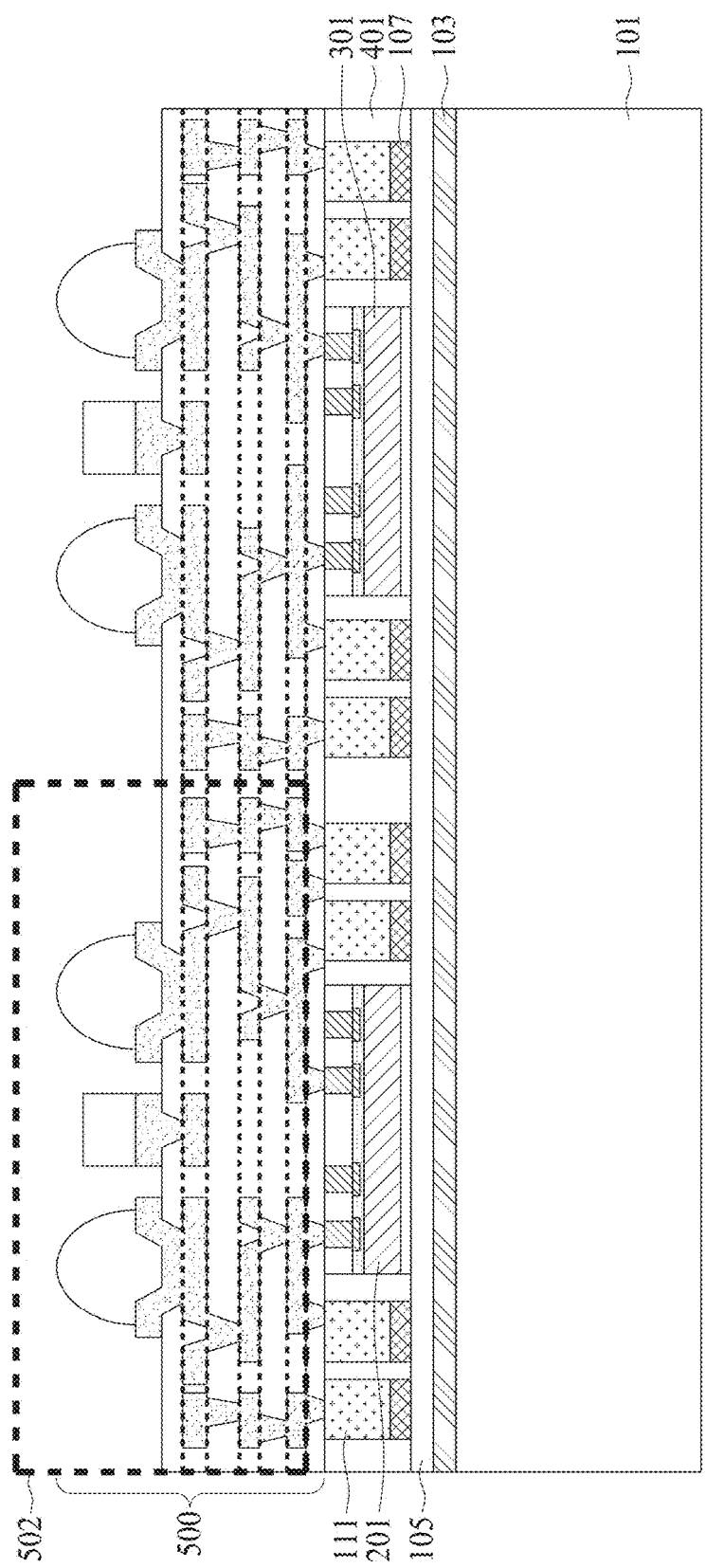
FIGS. 5A-5C illustrate a formation of a redistribution structure in accordance with some embodiments.
Figure 5B:
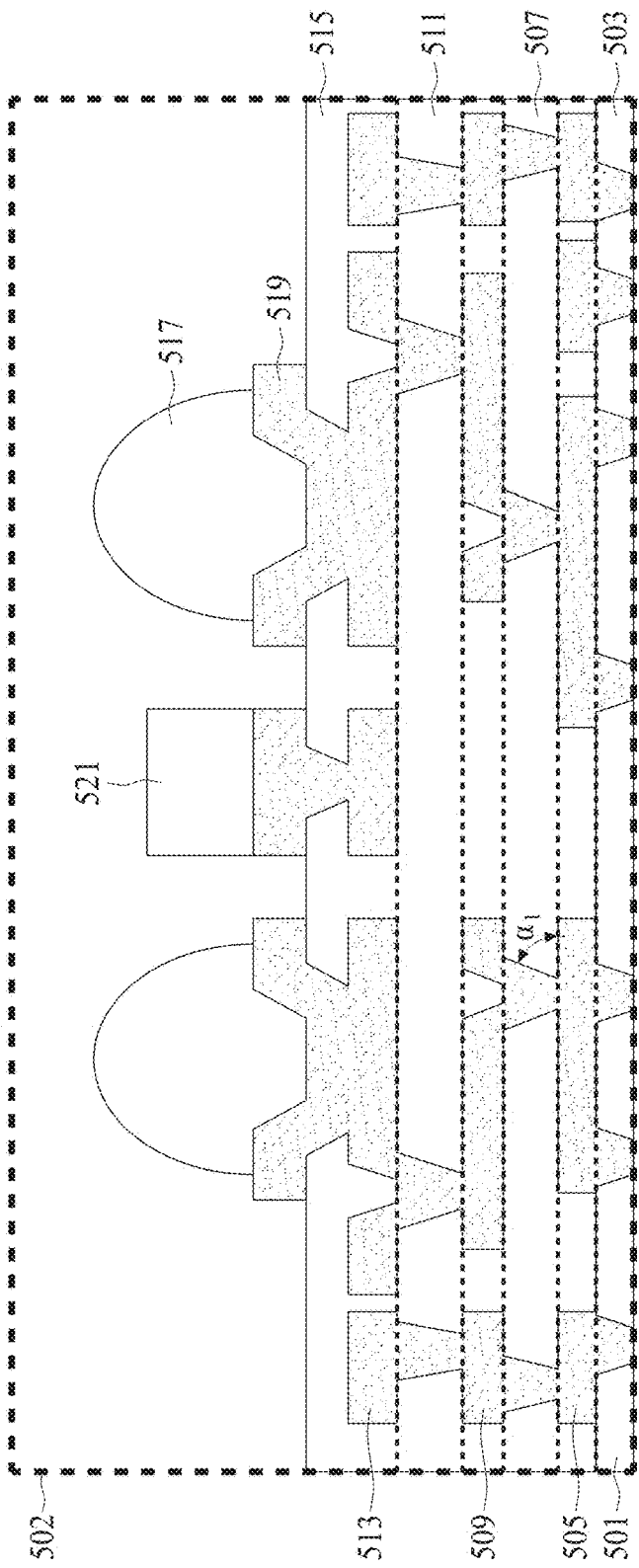

FIGS. 5A-5B illustrate a formation of a redistribution structure 500 over the encapsulant 401 and the now exposed first semiconductor device 201, second semiconductor device, and vias 111, with FIG. 5B illustrating a close up view of the dashed box 502 in FIG. 5A. In an embodiment the redistribution structure 500 may be formed by initially forming a first redistribution passivation layer 501 over the encapsulant 401. In an embodiment the first redistribution passivation layer 501 may be polybenzoxazole (PBO), although any suitable material, such as polyimide or a polyimide derivative, may alternatively be utilized. The first redistribution passivation layer 501 may be placed using, e.g., a spin-coating process to a thickness of between about 5 μm and about 17 μm, such as about 7 μm, although any suitable method and thickness may alternatively be used.

Once the first redistribution passivation layer 501 has been formed, first redistribution vias 503 may be formed through the first redistribution passivation layer 501 in order to make electrical connections to the first semiconductor device 201, the second semiconductor device 301, and the vias 111. In an embodiment the first redistribution vias 503 may be formed by using, e.g., damascene process whereby the first redistribution passivation layer 501 is initially patterned to form openings using, e.g., a photolithographic masking and etching process or, if the material of the first redistribution passivation layer 501 is photosensitive, exposing and developing the material of the first redistribution passivation layer 501. Once patterned, the openings are filled with a conductive material such as copper and any excess material is removed using, e.g., a planarization process such as chemical mechanical polishing. However, any suitable process or materials may be utilized.

After the first redistribution vias 503 have been formed, a first redistribution layer 505 is formed over an in electrical connection with the first redistribution vias 503. In an embodiment the first redistribution layer 505 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 505 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 505.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Optionally, if desired, after the first redistribution layer 505 has been formed, a surface treatment of the first redistribution layer 505 may be performed in order to help protect the first redistribution layer 505. In an embodiment the surface treatment may be a descum treatment such as a plasma treatment wherein the surface of the first redistribution layer 505 is exposed to a plasma of, e.g., argon, nitrogen, oxygen or a mixed Ar/N2/O2 ambient environment in order to improve the interface adhesion between the first redistribution layer 505 and overlying layers (e.g., the second redistribution passivation layer 507). However, any suitable surface treatment may be utilized.

After the first redistribution layer 505 has been formed, a second redistribution passivation layer 507 may be formed to help isolate the first redistribution layer 505. In an embodiment the second redistribution passivation layer 507 may be a different material than the first redistribution passivation layer 501 and may be, for example, a dielectric material with a higher adhesion to the underlying layers (e.g., the first redistribution layer 505 and the first redistribution passivation layer 501) such as a low-temperature cured polyimide, a negative tone material with a lower under-developing risk than the positive tone PBO used for the first redistribution passivation layer 501.

In one particular embodiment in which the low-temperature cured polyimide is used for the composition, the low-temperature cured polyimide may be formed by initially generating a low-temperature cured polyimide composition, which may comprise a low-temperature cured polyimide resin along with a photoactive components (PACs) placed into a low-temperature cured polyimide solvent. In an embodiment the low-temperature cured polyimide resin may comprise a polymer that is made up of monomers of the following formula:

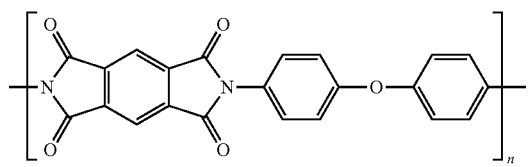

Additionally, while the low-temperature cured polyimide resin may be one of the embodiments as described above, the low-temperature cured polyimide resin is not intended to be limited to only the specific examples described herein. Rather, any suitable low-temperature cured polyimide resin may alternatively be utilized, and all such photosensitive polyimide resins are fully intended to be included within the scope of the embodiments.

The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, β-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo [2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl) iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl) iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzo-phenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

In an embodiment the low-temperature cured polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the low-temperature cured polyimide solvent for the low-temperature cured polyimide composition include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

In an embodiment the low-temperature cured polyimide resin and the PACs, along with any desired additives or other agents, are added to the low-temperature cured polyimide solvent for application. For example, the low-temperature cured polyimide resin may have a concentration of between about 5% and about 50%, such as about 25%, while the PACs may have a concentration of between about 0.1% and about 20%, such as about 5%. Once added, the mixture is then mixed in order to achieve an even composition throughout the low-temperature cured polyimide composition in order to ensure that there are no defects caused by an uneven mixing or non-constant composition. Once mixed together, the low-temperature cured polyimide composition may either be stored prior to its usage or else used immediately.

Once ready, the second redistribution passivation layer 507 may be utilized by initially applying the low-temperature cured polyimide composition onto the first redistribution layer 505 and the first redistribution passivation layer 501. The second redistribution passivation layer 507 may be applied to the first redistribution layer 505 so that the second redistribution passivation layer 507 coats an upper exposed surface of the first redistribution layer 505, and may be applied using a process such as a spin-on coating process, a dip coating method, an air-knife coating method, a curtain coating method, a wire-bar coating method, a gravure coating method, a lamination method, an extrusion coating method, combinations of these, or the like. The second redistribution passivation layer 507 may be placed to a thickness of between about 7 μm to about 35 μm.

Once applied, the second redistribution passivation layer 507 may be baked in order to cure and dry the second redistribution passivation layer 507 prior to exposure (described further below). The curing and drying of the second redistribution passivation layer 507 removes the solvent components while leaving behind the resin, the PACs, and any other chosen additives. In an embodiment the pre-bake may be performed at a temperature suitable to evaporate the solvent, such as between about 40° C. and 150° C., such as about 150° C., although the precise temperature depends upon the materials chosen for the second redistribution passivation layer 507. The pre-bake is performed for a time sufficient to cure and dry the second redistribution passivation layer 507, such as between about 10 seconds to about 5 minutes, such as about 270 seconds.

Once cured and dried, the second redistribution passivation layer 507 may be patterned in order to form openings to first redistribution layer 505. In an embodiment the patterning may be initiated by placing the second redistribution passivation layer 507 into a imaging device (not separately illustrated in FIGS. 5A-5B) for exposure. The imaging device may comprise a support plate, a energy source, and a patterned mask between the support plate and the energy source.

In an embodiment the energy source supplies energy such as light to the second redistribution passivation layer 507 in order to induce a reaction of the PACs, which in turn reacts with the second redistribution passivation layer polymer resin to chemically alter those portions of the second redistribution passivation layer 507 to which the energy impinges. In an embodiment the energy may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy, such as mercury vapor lamps, xenon lamps, carbon arc lamps or the like, may also be utilized.

The patterned mask is located between the energy source and the second redistribution passivation layer 507 in order to block portions of the energy to form a patterned energy prior to the energy actually impinging upon the second redistribution passivation layer 507. In an embodiment the patterned mask may comprise a series of layers (e.g., substrate, absorbance layers, anti-reflective coating layers, shielding layers, etc.) to reflect, absorb, or otherwise block portions of the energy from reaching those portions of the second redistribution passivation layer 507 which are not desired to be illuminated. The desired pattern may be formed in the patterned mask by forming openings through the patterned mask in the desired shape of illumination.

In an embodiment the second redistribution passivation layer 507 is placed on the support plate. Once the pattern has been aligned to the second redistribution passivation layer 507, the energy source generates the desired energy (e.g., light) which passes through the patterned mask on its way to the second redistribution passivation layer 507. The patterned energy impinging upon portions of the second redistribution passivation layer 507 induces a reaction of the PACs within the second redistribution passivation layer 507. The chemical reaction products of the PACs' absorption of the patterned energy (e.g., acids/bases/free radicals) then reacts with the second redistribution passivation layer polymer resin, chemically altering the second redistribution passivation layer 507 in those portions that were illuminated through the patterned mask.

After the second redistribution passivation layer 507 has been exposed, a first post-exposure bake (PEB) may be used in order to assist in the generating, dispersing, and reacting of the acid/base/free radical generated from the impingement of the energy upon the PACs during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the second redistribution passivation layer 507 may be increased to between about 70° C. and about 150° C. for a period of between about 40 seconds and about 120 seconds, such as about 2 minutes. In a particular, embodiments, the post-development bake may be performed at temperatures of 140° C., 150° C., 130° C., 110° C., 90° C. and 70° C., each for about 2 minutes.

Once the second redistribution passivation layer 507 has been exposed and baked, the second redistribution passivation layer 507 may be developed with the use of a developer. In an embodiment in which the second redistribution passivation layer 507 is the low temperature cured polyimide, the first developer may be an organic solvent or critical fluid may be utilized to remove those portions of the second redistribution passivation layer 507 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon (A515), hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the second redistribution passivation layer 507 using, e.g., a spin-on process. In this process the first developer is applied to the second redistribution passivation layer 507 from above the second redistribution passivation layer 507 while the second redistribution passivation layer 507 is rotated. In an embodiment the first developer may be at a temperature of between about 10° C. and about 80° C., such as about 50° C., and the development may continue for between about 1 minute to about 60 minutes, such as about 30 minutes. In an embodiment in which low temperature cured polyimide is utilized for the second redistribution passivation layer 507, the material of the low temperature cured polyimide has a dissolution rate between the exposed and the non-exposed regions of greater than 6 (while PBO may have a dissolution rate of about 3.5).

However, while the spin-on method described herein is one suitable method for developing the second redistribution passivation layer 507 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

Once the second redistribution passivation layer 507 has been developed, the second redistribution passivation layer 507 may be rinsed. In an embodiment the second redistribution passivation layer 507 may be rinsed with a rinsing liquid such as propylene glycol monomethyl ether acetate (C260), although any suitable rinse solution, such as water, may be used.

After development a post development baking process may be utilized in order to help polymerize and stabilize the second redistribution passivation layer 507 after the development process. In an embodiment the post-developing baking process may be performed at a temperature of between about 80° C. and about 200° C., such as about 140° C. for a time of between about 60 sec and about 300 sec, such as about 2 minutes.

After the post-development baking and the RDL surface treatments, the second redistribution passivation layer 507 may be cured. In an embodiment in which the second redistribution passivation layer 507 comprises a low temperature cured polyimide, the curing process may be performed at a low temperature of less than about 230° C., such as a temperature of between about 200° C. and 230° C., such as about 220° C. for a time of between about 1 hour and about 2 hours. In particular embodiments the curing process may be performed at a temperature of about 230° C. for about 1 hour, a temperature of about 220° C. for a time of about 1 hour, or at a temperature of about 200° C. for a time of about 2 hours. However, any suitable temperature and time may be utilized.

By forming the second redistribution passivation layer 507 from a material such as the low temperature cured polyimide, a material with an increased adhesion to the underlying layers (e.g., the first redistribution passivation layer 501 and the first redistribution layer 505) may be obtained. For example, by using the low temperature cured polyimide for the second redistribution passivation layer 507, the second redistribution passivation layer 507 may have an adhesion to the first redistribution passivation layer 501 (e.g., PBO) of about 582 kg/cm$^2$). Additionally, the material of the second redistribution passivation layer 507 will have an increased adhesion to the material of the first redistribution layer 505 of about 680 kg/cm$_2$ even without a post-exposure baking process. This increased adhesion to both the material of the first redistribution layer 505 and the second redistribution passivation layer 507 leads to a reduction or even an elimination of delamination between the second redistribution passivation layer 507 and the first redistribution passivation layer 501 during subsequent processing and use.

Additionally, by using a material such as the low-temperature cured polyimide for the second redistribution passivation layer 507, improvements in the openings formed within these structures may be achieved. For example, in openings formed within the second redistribution passivation layer 507, the opening may have a via angle $\alpha_1$ of between about 60° and about 70°, such as about 65° (compared to PBO's via angle of between about 35° and about 40° and the corners within openings formed within the low temperature cured polyimide are sharp with a via bottom footing of less than 0.5 μm, while the use of a material such as PBO will cause the openings to have undesirable corner rounding and via bottom rounding.

After the second redistribution passivation layer 507 has been patterned, a second redistribution layer 509 may be formed to extend through the openings formed within the second redistribution passivation layer 507 and make electrical connection with the first redistribution layer 505. In an embodiment the second redistribution layer 509 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the second redistribution layer 509 has been formed, a third redistribution passivation layer 511 is applied over the second redistribution layer 509 in order to help isolate and protect the second redistribution layer 509. In an embodiment the third redistribution passivation layer 511 may be formed of similar materials and in a similar fashion as the second redistribution passivation layer 507. For example, the third redistribution passivation layer 511 may be formed of a low-temperature cured polyimide that has been applied and patterned as described above with respect to the second redistribution passivation layer 507. However, any suitable material or process of manufacture may be utilized.

After the third redistribution passivation layer 511 has been patterned, a third redistribution layer 513 may be formed to extend through the openings formed within the third redistribution passivation layer 511 and make electrical connection with the second redistribution layer 509. In an embodiment the third redistribution layer 513 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the third redistribution layer 513 has been formed, a fourth redistribution passivation layer 515 may be formed over the third redistribution layer 513 in order to help isolate and protect the third redistribution layer 513. In an embodiment the fourth redistribution passivation layer 515 may be formed of similar materials and in a similar fashion as the second redistribution passivation layer 507. For example, the fourth redistribution passivation layer 515 may be formed of a low-temperature cured polyimide that has been applied and patterned as described above with respect to the second redistribution passivation layer 507. However, any suitable material or process of manufacture may be utilized.

Figure 5C:
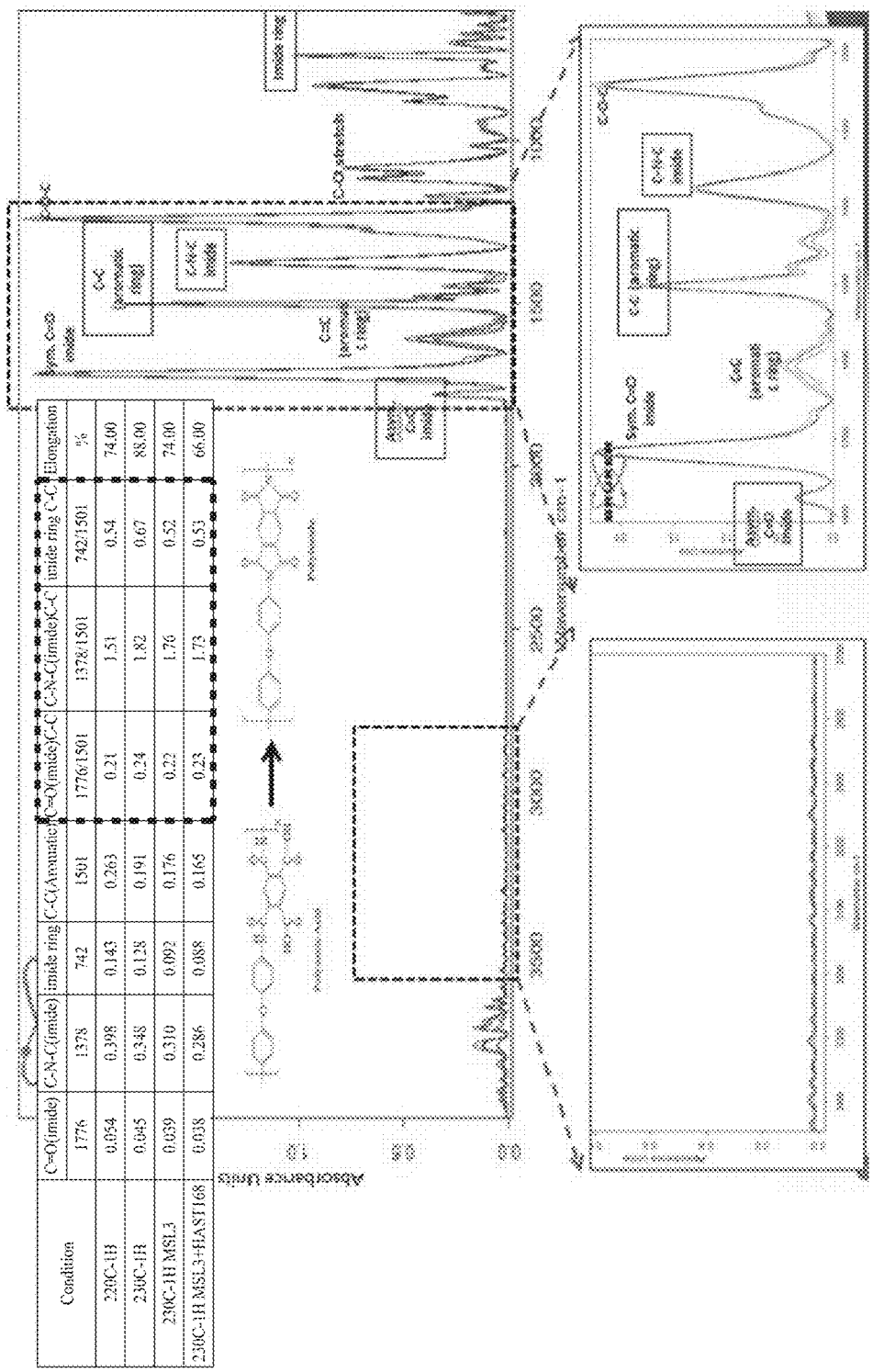

By utilizing a hybrid structure that includes both a material such as PBO and a material such as low-temperature cured polyimide, the benefits of each material may be obtained while minimizing the downside of the materials. For example, in an embodiment the resolution that may be obtained with the PBO (with an AR of 1.5) and the low temperature cured polyimide (with an AR of 1.1), the patterning of the structure may achieve a critical dimension of less than 6 μm when the material such as the PBO is formed such that there are no redistribution layers under the PBO. Additionally, by using the low temperature cured polyimide over the PBO, a larger adhesion between the low-temperature cured polyimide and the underlying redistribution layers may be achieved, and the overall reliability of the structure may be improved in order to help the structure pass quality tests, such as TCB-1050x, uHAST-192 hrs, and HTS-1000 hrs reliability tests. In particular, during some tests, such as the uHAST test, the structure of PBO may decompose and lead to reliability issues while the structure of the low temperature cured polyimide does not decompose. For example, FIG. 5C illustrates test date taken after the uHAST test which illustrates that the structure of the low temperature cured polyimide does not change after the reliability tests.

In particular, the low temperature cured polyimide as described herein has a adhesion with underlying layers (comprising, e.g., PBO and copper) of about 759 kg/cm$^2$ while PBO has an adhesion of about 643 kg/cm$^2$. Additionally, the low temperature cured polyimide has a low film developing film loss of about 1.5 μm (while PBO has a high film loss of greater than 4 μm, such as about 4.5 μm) and has a film shrinkage rate (after curing and after developing) of about 30% (compared to PBO's film shrinkage rate of about 18%).

Returning to FIGS. 5A-5B, these figures further illustrate a formation of underbump metallizations 519 and third external connectors 517 to make electrical contact with the third redistribution layer 513. In an embodiment the underbump metallizations 519 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 519. Any suitable materials or layers of material that may be used for the underbump metallizations 519 are fully intended to be included within the scope of the embodiments.

In an embodiment the underbump metallizations 519 are created by forming each layer over the third redistribution layer 513 and along the interior of the openings through the fourth redistribution passivation layer 515. The forming of each layer may be performed using a plating process, such as electrochemical plating, although other processes of formation, such as sputtering, evaporation, or PECVD process, may be used depending upon the desired materials. The underbump metallizations 519 may be formed to have a thickness of between about 0.7 μm and about 10 μm, such as about 5 μm.

In an embodiment the third external connectors 517 may be placed on the underbump metallizations 519 and may be a ball grid array (BGA) which comprises a eutectic material such as solder, although any suitable materials may alternatively be used. In an embodiment in which the third external connectors 517 are solder balls, the third external connectors 517 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the third external connectors 517 have been formed, a test may be performed to ensure that the structure is suitable for further processing.

Additionally, a surface device 521 may also be placed in contact with the third redistribution layer 513 through the underbump metallizations 519. The surface device 521 may be used to provide additional functionality or programming to the first semiconductor device 201, the second semiconductor device 301, or the package as a whole. In an embodiment the surface device 521 may be a surface mount device (SMD) or an integrated passive device (IPD) that comprises passive devices such as resistors, inductors, capacitors, jumpers, combinations of these, or the like that are desired to be connected to and utilized in conjunction with the first semiconductor device 201 or the second semiconductor device 301, or other parts of the package.

The surface device 521 may be connected to the underbump metallizations 519, for example, by sequentially dipping connectors such as solder balls (not separately illustrated in FIGS. 5A-5B) of the surface device 521 into flux, and then using a pick-and-place tool in order to physically align the connectors of the surface device 521 with individual ones of the underbump metallizations 519. In an embodiment in which the surface device 521 uses connectors such as solder balls, once the surface device 521 has been placed a reflow process may be performed in order to physically bond the surface device 521 with the underlying underbump metallizations 519 and a flux clean may be performed. However, any other suitable connector or connection process may be utilized, such as metal-to-metal bonding or the like.

Figure 6:
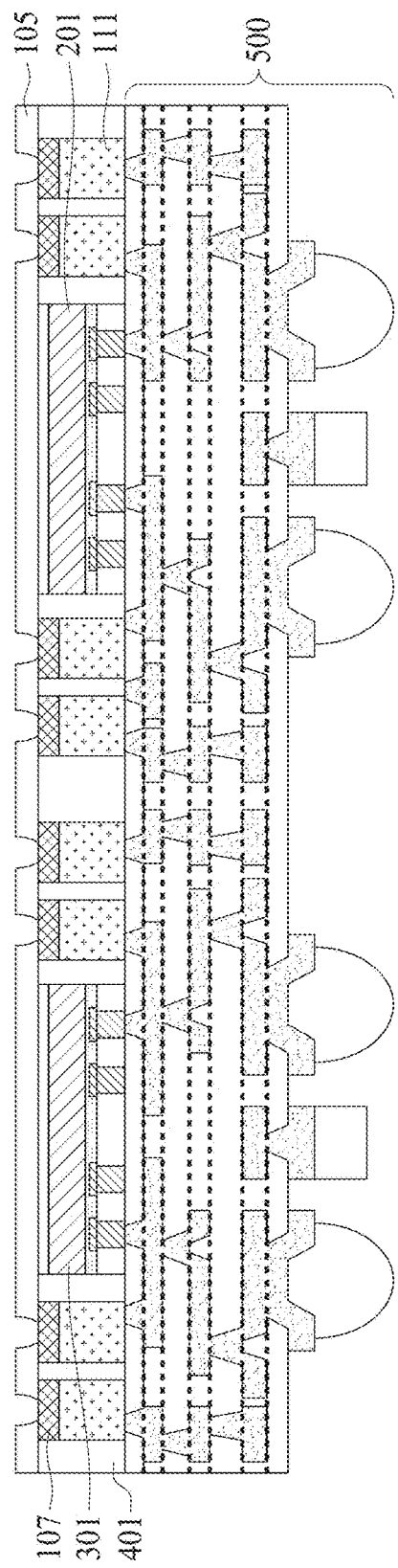
FIG. 6 illustrate an exposure of the vias in accordance with some embodiments.

FIG. 6 illustrates a debonding of the first carrier substrate 101 from the first semiconductor device 201 and the second semiconductor device 301. In an embodiment the third external connectors 517 and, hence, the structure including the first semiconductor device 201 and the second semiconductor device 301, may be attached to a ring structure (not separately illustrated in FIG. 6). The ring structure may be a metal ring intended to provide support and stability for the structure during and after the debonding process. In an embodiment the third external connectors 517, the first semiconductor device 201, and the second semiconductor device 301 are attached to the ring structure using, e.g., an ultraviolet tape (also not illustrated in FIG. 6), although any other suitable adhesive or attachment may alternatively be used.

Once the third external connectors 517 and, hence, the structure including the first semiconductor device 201 and the second semiconductor device 301 are attached to the ring structure, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 517, the first semiconductor device 201, and the second semiconductor device 301.

However, while a ring structure may be used to support the third external connectors 517, such as description is merely one method that may be used and is not intended to be limiting upon the embodiments. In another embodiment the third external connectors 517 may be attached to a second carrier substrate using, e.g., a first glue. In an embodiment the second carrier substrate is similar to the first carrier substrate 101, although it may also be different. Once attached, the adhesive layer 103 may be irradiated and the adhesive layer 103 and the first carrier substrate 101 may be physically removed.

FIG. 6 also illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 6) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form openings over the vias 111 to have a width of between about 100 μm and about 300 μm, such as about 200 μm.

In another embodiment, the polymer layer 105 may be patterned by initially applying a photoresist (not individually illustrated in FIG. 6) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 7A:
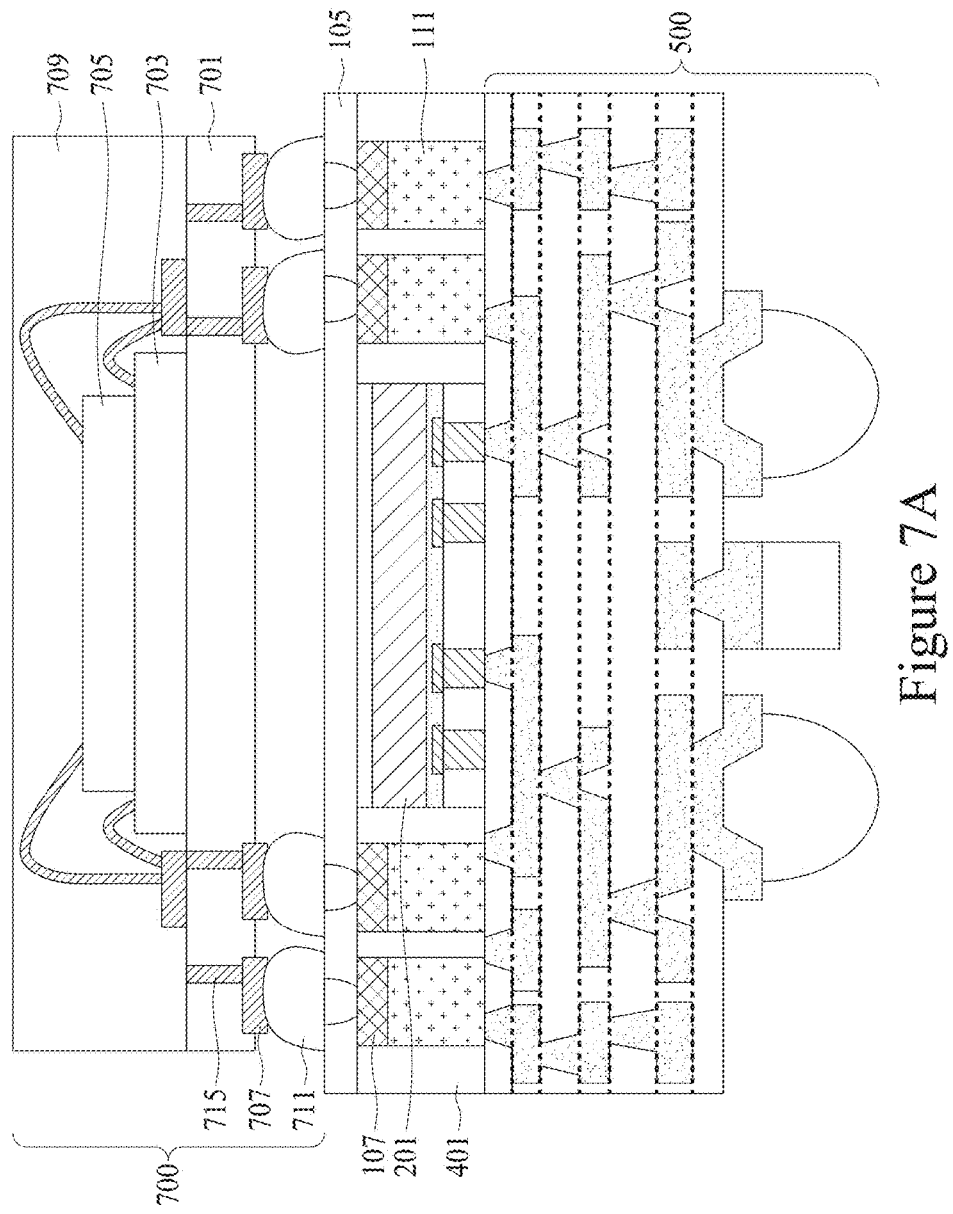

FIG. 7A illustrates a bonding of a first package 700. In an embodiment the first package 700 may comprise a third substrate 701, a third semiconductor device 703, a fourth semiconductor device 705 (bonded to the third semiconductor device 703), third contact pads 707, a second encapsulant 709, and fourth external connections 711. In an embodiment the third substrate 701 may be, e.g., a packaging substrate comprising internal interconnects (e.g., through substrate vias 715) to connect the third semiconductor device 703 and the fourth semiconductor device 705 to the vias 111.

Alternatively, the third substrate 701 may be an interposer used as an intermediate substrate to connect the third semiconductor device 703 and the fourth semiconductor device 705 to the vias 111. In this embodiment the third substrate 701 may be, e.g., a silicon substrate, doped or undoped, or an active layer of a silicon-on-insulator (SOI) substrate. However, the third substrate 701 may also be a glass substrate, a ceramic substrate, a polymer substrate, or any other substrate that may provide a suitable protection and/or interconnection functionality. These and any other suitable materials may be used for the third substrate 701.

The third semiconductor device 703 may be a semiconductor device designed for an intended purpose such as being a logic die, a central processing unit (CPU) die, a memory die (e.g., a DRAM die), combinations of these, or the like. In an embodiment the third semiconductor device 703 comprises integrated circuit devices, such as transistors, capacitors, inductors, resistors, first metallization layers (not shown), and the like, therein, as desired for a particular functionality. In an embodiment the third semiconductor device 703 is designed and manufactured to work in conjunction with or concurrently with the first semiconductor device 201.

The fourth semiconductor device 705 may be similar to the third semiconductor device 703. For example, the fourth semiconductor device 705 may be a semiconductor device designed for an intended purpose (e.g., a DRAM die) and comprising integrated circuit devices for a desired functionality. In an embodiment the fourth semiconductor device 705 is designed to work in conjunction with or concurrently with the first semiconductor device 201 and/or the third semiconductor device 703.

The fourth semiconductor device 705 may be bonded to the third semiconductor device 703. In an embodiment the fourth semiconductor device 705 is only physically bonded with the third semiconductor device 703, such as by using an adhesive. In this embodiment the fourth semiconductor device 705 and the third semiconductor device 703 may be electrically connected to the third substrate 701 using, e.g., wire bonds, although any suitable electrical bonding may be alternatively be utilized.

Alternatively, the fourth semiconductor device 705 may be bonded to the third semiconductor device 703 both physically and electrically. In this embodiment the fourth semiconductor device 705 may comprise fourth external connections (not separately illustrated in FIG. 7A) that connect with fifth external connection (also not separately illustrated in FIG. 7A) on the third semiconductor device 703 in order to interconnect the fourth semiconductor device 705 with the third semiconductor device 703.

The third contact pads 707 may be formed on the third substrate 701 to form electrical connections between the third semiconductor device 703 and, e.g., the fourth external connections 711. In an embodiment the third contact pads 707 may be formed over and in electrical contact with electrical routing (such as through substrate vias 715) within the third substrate 701. The third contact pads 707 may comprise aluminum, but other materials, such as copper, may alternatively be used. The third contact pads 707 may be formed using a deposition process, such as sputtering, to form a layer of material (not shown) and portions of the layer of material may then be removed through a suitable process (such as photolithographic masking and etching) to form the third contact pads 707. However, any other suitable process may be utilized to form the third contact pads 707. The third contact pads 707 may be formed to have a thickness of between about 0.5 µm and about 4 µm, such as about 1.45 µm.

The second encapsulant 709 may be used to encapsulate and protect the third semiconductor device 703, the fourth semiconductor device 705, and the third substrate 701. In an embodiment the second encapsulant 709 may be a molding compound and may be placed using a molding device (not illustrated in FIG. 7A). For example, the third substrate 701, the third semiconductor device 703, and the fourth semiconductor device 705 may be placed within a cavity of the molding device, and the cavity may be hermetically sealed. The second encapsulant 709 may be placed within the cavity either before the cavity is hermetically sealed or else may be injected into the cavity through an injection port. In an embodiment the second encapsulant 709 may be a molding compound resin such as polyimide, PPS, PEEK, PES, a heat resistant crystal resin, combinations of these, or the like.

Once the second encapsulant 709 has been placed into the cavity such that the second encapsulant 709 encapsulates the region around the third substrate 701, the third semiconductor device 703, and the fourth semiconductor device 705, the second encapsulant 709 may be cured in order to harden the second encapsulant 709 for optimum protection. While the exact curing process is dependent at least in part on the particular material chosen for the second encapsulant 709, in an embodiment in which molding compound is chosen as the second encapsulant 709, the curing could occur through a process such as heating the second encapsulant 709 to between about 100° C. and about 130° C., such as about 125° C. for about 60 sec to about 3000 sec, such as about 600 sec. Additionally, initiators and/or catalysts may be included within the second encapsulant 709 to better control the curing process.

However, as one having ordinary skill in the art will recognize, the curing process described above is merely an exemplary process and is not meant to limit the current embodiments. Other curing processes, such as irradiation or even allowing the second encapsulant 709 to harden at ambient temperature, may alternatively be used. Any suitable curing process may be used, and all such processes are fully intended to be included within the scope of the embodiments discussed herein.

In an embodiment the fourth external connections 711 may be formed to provide an external connection between the third substrate 701 and, e.g., the vias 111. The fourth external connections 711 may be contact bumps such as microbumps or controlled collapse chip connection (C4) bumps and may comprise a material such as tin, or other suitable materials, such as silver or copper. In an embodiment in which the fourth external connections 711 are tin solder bumps, the fourth external connections 711 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fourth external connections 711 have been formed, the fourth external connections 711 are aligned with and placed over the vias 111, and a bonding is performed. For example, in an embodiment in which the fourth external connections 711 are solder bumps, the bonding process may comprise a reflow process whereby the temperature of the fourth external connections 711 is raised to a point where the fourth external connections 711 will liquefy and flow, thereby bonding the first package 700 to the vias 111 once the fourth external connections 711 resolidifies.

FIG. 7A also illustrates a debonding of the third external connectors 517 from the ring structure and a singulation of the structure to form a first integrated fan out package-on-package (InFO-POP) structure. In an embodiment the third external connectors 517 may be debonded from the ring structure by initially bonding the first package 700 to a second ring structure using, e.g., a second ultraviolet tape. Once bonded, the ultraviolet tape may be irradiated with ultraviolet radiation and, once the ultraviolet tape has lost its adhesiveness, the third external connectors 517 may be physically separated from the ring structure.

Once debonded, a singulation of the structure to form the first InFO-POP structure is performed. In an embodiment the singulation may be performed by using a laser or a saw blade (not shown) to slice through the encapsulant 401 and the polymer layer 105 between the vias 111, thereby separating one section from another to form the first InFO-POP structure with the second semiconductor device 301. However, as one of ordinary skill in the art will recognize, utilizing a saw blade to singulate the first InFO-POP structure is merely one illustrative embodiment and is not intended to be limiting.

Alternative methods for singulating the first InFO-POP structure, such as utilizing one or more etches to separate the first InFO-POP structure, may alternatively be utilized. These methods and any other suitable methods may alternatively be utilized to singulate the first InFO-POP structure.

During the singulation process, even more advantages of using embodiments described herein may be seen. By utilizing a material such as the low temperature cured polyimide for the second redistribution passivation layer 507, PBO residue that is usually seen after singulation within the scribe line structure when PBO is utilized is simply not present. Additionally, residue of the low temperature cured polyimide structure is also not visible, and molding compound grains on the scribe line are also not visible. With less visible residue, there are fewer concerns or problems caused by such residue.

In another embodiment the first redistribution passivation layer 501, instead of being a material such as PBO as described above with respect to FIG. 5B, may instead be a material similar to the material of the second redistribution passivation layer 507. For example, in this embodiment the first redistribution passivation layer 501 may be a low-temperature cured polyimide formed by application, exposure, development, and post-development baking as described above. However, any suitable material or method of manufacture may be utilized.

By forming the first redistribution passivation layer 501 to be similar to the second redistribution passivation layer 507, each of the passivation layers over the encapsulant 401 on the front side of the package are formed using a material such as the low-temperature polyimide. By forming each of the passivation layers on the front side of the package from the low-temperature polyimide, the increased adhesion that is obtained (e.g., an adhesion of about 610 kg/cm$^2$) by using the low-temperature polyimide is increased and the risk of delamination is reduced. Additionally, the use of the low-temperature polyimide can achieve the 6 μm via openings without scums.

In yet another embodiment, not only is the first redistribution passivation layer 501 made of a similar material as the second redistribution passivation layer 507 (e.g., a low-temperature cured polyimide), but the first passivation layer 211 is also formed from a similar material as the second redistribution passivation layer 507. For example, in this embodiment the first passivation layer 211 (on the first semiconductor device 201) may be a low-temperature cured polyimide formed by application, exposure, development, post-development baking and curing as described above. As such, a full low temperature cured polyimide scheme is utilized within the process.

By forming both the first passivation layer 211 and the first redistribution passivation layer 501 to be a similar material as the rest of the front side passivation layers (e.g., the second redistribution passivation layer 507, the third redistribution passivation layer 511, and the fourth redistribution passivation layer 515), the benefits of the material such as the low-temperature polyimide (e.g., its adhesion) may be extended. Additionally, in embodiments in which the die is a DRAM die, the low-temperature polyimide allows for the removal of PBO's high temperature processes (320° C. for 1.5 hours to cure the high temperature PBO) that can cause upwards of a 2.5% yield loss.

In yet another embodiment, in addition to the first passivation layer 211 and the first redistribution passivation layer 501 being a similar material as the second redistribution passivation layer 507, the polymer layer 105 as well is formed from a similar material as the second redistribution passivation layer 507. In this embodiment the polymer layer 105, instead of being a material such as PBO as described above, is instead a material such as the low-temperature polyimide. For example, in this embodiment the polymer layer 105 may be a low-temperature cured polyimide formed by application, exposure, development, and post-development baking as described above. However, any suitable material or method of manufacture may be utilized.

By forming all of the first passivation layer 211, the first redistribution passivation layer 501, and the polymer layer 105 to be a similar material as the rest of the front side passivation layers (e.g., the second redistribution passivation layer 507, the third redistribution passivation layer 511, and the fourth redistribution passivation layer 515), the benefits of the material (e.g., its adhesion) may be achieved on both sides of the encapsulant 401. As such, with the increased adhesion, a reduction in the possibility of delamination may be reduced or even eliminated.

FIG. 7B illustrates a chart of the increase in adhesion that may be obtained by using the low temperature cured polyimide (represented in FIG. 7B by the term "LT-PI") for the first redistribution layer 505 (e.g., "PM1") and for the second redistribution passivation layer 507 (e.g., "PM2"). As can be seen, in an embodiment with a low temperature post-development bake ("PDB"), the adhesion may be as high as 759 Kg/cm$^2$, which is greater than the control of PBO which has an adhesion of 643 Kg/cm$^2$. Further, even without a post-development bake, the low temperature cured polyimide will still show an improvement over the control of 680 Kg/cm$^2$.

Figure 8A:
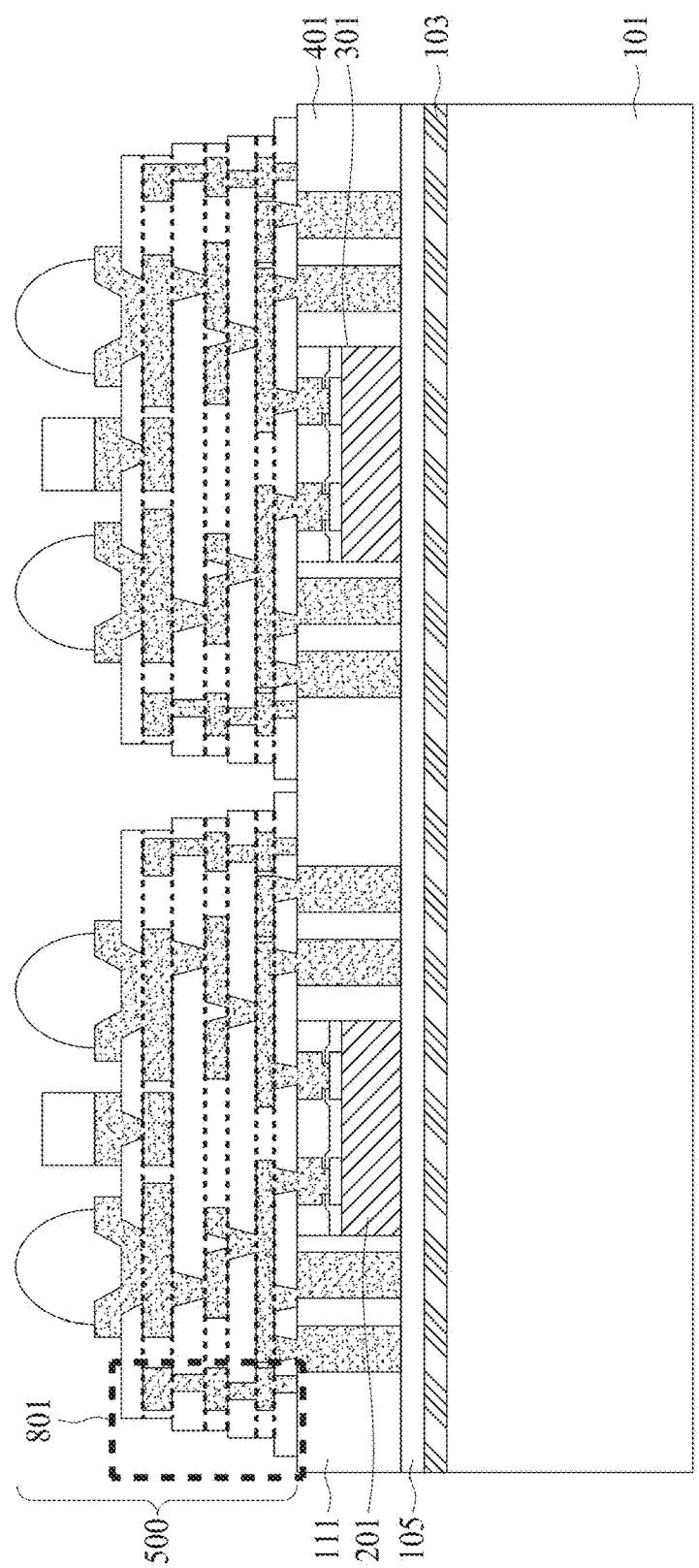
FIGS. 8A-8B illustrate an open scribe line in accordance with some embodiments.
Figure 8B:
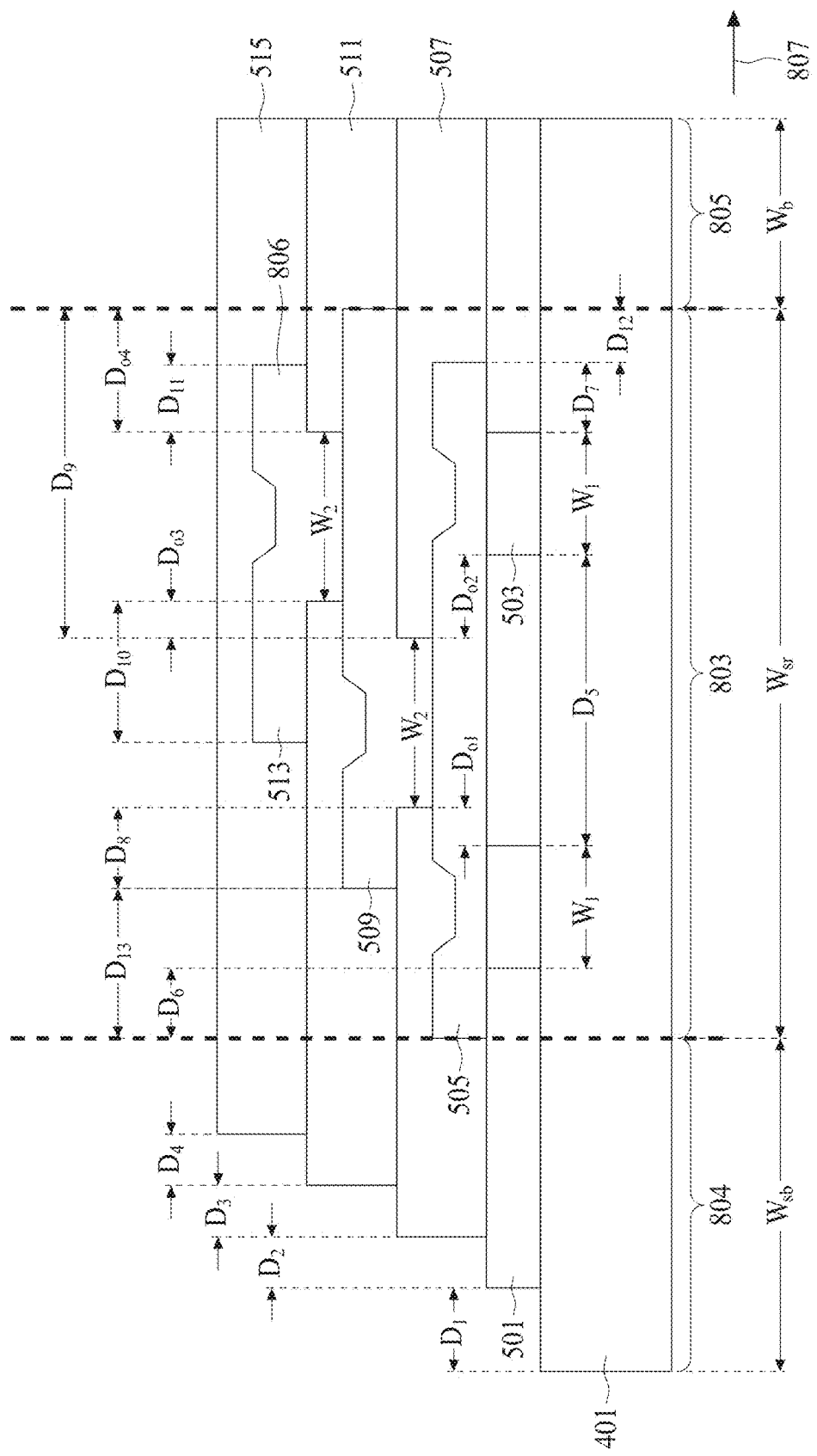

FIGS. 8A-8B illustrate another embodiment in which the previous embodiments (including all of the embodiments with differing and similar materials as described above with respect to FIGS. 1-7B) are utilized along with a process to form an open scribe line, with FIG. 8B illustrating a close-up view of the dashed box labeled 801 in FIG. 8A. In this embodiment the redistribution structure 500 may be divided into a scribe region 804, a seal ring region 803, a buffer region 805, and an active circuitry region 807. The scribe region 804 will be the region where the singulation will take place, while the seal ring region 803 contains a seal ring 806 that will be used to help isolate the interior structure. Additionally, the buffer region 805 allows for a distance between the seal ring region 803 and the active circuitry of the rest of the redistribution structure that may be found in the active circuitry region 807.

In a particular configuration the seal ring region 803 may have a seal ring width $W_{sr}$ of between about 10 μm and about 200 μm, such as about 60 μm and which has the step back of each passivation layer located on a first side of the seal ring 806. The scribe region 804 may have a step back width $W_{sb}$ of between about 5 μm and about 100 μm, such as about 30 μm. Additionally, a buffer region 805, which may be used to provide a buffer between the seal ring 806 and the remainder of the redistribution layers, may have a buffer region width $W_b$ of between about 5 μm and about 100 μm, such as about 20 μm. However, any suitable dimensions may be utilized.

In this embodiment, the first redistribution passivation layer 501, the second redistribution passivation layer 507, the third redistribution passivation layer 511, and the fourth redistribution passivation layer 515 within the scribe region 804 are formed (e.g., during the application, exposure, developing, and low temperature curing) so that each passivation layer within the scribe region 804 is stepped back from the passivation layer beneath it. Looking at FIG. 8B, it can be seen that in this embodiment the first redistribution passivation layer 501 does not cover the length of the encapsulant 401 and the second redistribution passivation layer 507 does not cover the length of the first redistribution passivation layer 501. Additionally, the third redistribution passivation layer 511 is formed so as to cover only a portion and not the length of the second redistribution passivation layer 507, and the fourth redistribution passivation layer 515 is formed so as to cover only a portion and not the length of the third redistribution passivation layer 511.

FIG. 8B illustrates a close up view of the result of this pullback of the successively higher passivation layers. In an embodiment the first redistribution passivation layer 501 may be pulled back from the desired cut point (e.g., during singulation) and have a first edge that is located a first distance $D_1$ of between about 1 μm and about 50 μm, such as about 8 μm, away from the cut point. Similarly, an edge of the second redistribution passivation layer 507 may be pulled back from the edge of the first redistribution passivation layer 501 a second distance $D_2$ of between about 1 μm and about 50 μm, such as about 8 μm, and an edge of the third redistribution passivation layer 511 may be pulled back from the edge of the second redistribution passivation layer 507 a third distance $D_3$ of between about 1 μm and about 50 μm, such as about 8 μm. Finally, an edge of the fourth redistribution passivation layer 515 may be pulled back from the third redistribution passivation layer 511 a fourth distance $D_4$ of between about 1 μm and about 50 μm, such as about 8 μm.

However, while the above described structure has been described with specific dimensions, one of ordinary skill in the art will recognize that these descriptions are intended to be illustrative only and are not intended to be limiting upon the embodiments. Rather, any suitable dimensions may be utilized, and all such dimensions are fully intended to be included within the scope of the embodiments.

Additionally, in an embodiment the metallization within the first redistribution layer 505, the second redistribution layer 509, and the third redistribution layer 513 that are located within the seal ring region 803 are formed so as to be the seal ring 806 in a stagger via opening configuration. In an embodiment the seal ring 806 may be formed by forming portions of the first redistribution layer 505, the second redistribution layer 509 and the third redistribution layer 513 that are located within the seal ring region 803 to have dimensions appropriate for the seal ring 806. Looking first at the first redistribution vias 503 within the seal ring 806, each of the first redistribution vias 503 within the seal ring 806 may be formed so as to have a first width $W_1$ of between about 1 μm and about 50 μm, such as about 9 μm, and the first redistribution vias 503 may be separated by a fifth distance $D_5$ of between about 5 μm and about 50 μm, such as about 25 μm.

The first redistribution layer 505 within the seal ring 806 may be formed over the first redistribution vias 503 to a thickness over the first redistribution passivation layer 501 of between about 3 μm and about 10 μm, such as about 6 μm, and may be formed to extend past the vias 503 (towards the pulled back edge of the second redistribution passivation layer 507) a sixth distance $D_6$ of between about 1 μm and about 20 μm, such as about 6 μm, and may also be formed to extend past the first redistribution vias 503 (towards the active circuitry region 807 of the first redistribution layer 505) a seventh distance $D_7$ of between about 1 μm and about 20 μm, such as about 7 μm. The first redistribution layer 505 within the seal ring 806 may be separated from the buffer region 805 by a twelfth distance $D_{12}$ of between about 1 μm and about 20 μm, such as about 4 μm.

The second redistribution layer 509 may be formed over and in contact with the first redistribution layer 505 to a thickness over the second redistribution passivation layer 507 of between about 3 μm and about 10 μm, such as about 4 μm. In an embodiment the second redistribution layer 509 will be formed to extend through the second redistribution passivation layer 507 so that a section of the second redistribution layer 509 that extends has a second width $W_2$ of between about 1 μm and about 50 μm, such as about 14 μm, and is offset from one of the first redistribution vias 503 a first offset distance $D_{o1}$ of between about 1 μm and about 50 μm, such as about 3 μm, and is offset from another of the first redistribution vias 503 a second offset distance $D_{o2}$ of between about 1 μm and about 50 μm, such as about 8 μm. Additionally, the second redistribution layer 509 may be formed to extend towards the pulled back edge of the third redistribution passivation layer 511 an eighth distance $D_8$ of between about 5 μm and about 50 μm, such as about 20 μm, and extends towards the active circuitry region 807 of the second redistribution layer 509 a ninth distance $D_9$ of between about 5 μm and about 100 μm, such as about 29 μm. The second redistribution layer 509 may be separated from the scribe region 804 a thirteenth distance $D_{13}$ of between about 1 μm and about 50 μm, such as about 11 μm.

The third redistribution layer 513 may be formed over and in contact with the second redistribution layer 509 to a thickness over the third redistribution passivation layer 511 of between about 3 μm and about 15 μm, such as about 5 μm. In an embodiment the third redistribution layer 513 will be formed to extend through the third redistribution passivation layer 511 so that a section of the third redistribution layer 513 that extends has the second width $W_2$, and is offset from the first extension (of the second redistribution layer 509) by a third offset distance $D_{o3}$ of between about 1 μm and about 50 μm, such as about 3 μm, and is offset from an edge of the second redistribution layer 509 by a fourth offset distance $D_{o4}$ of between about 5 μm and about 50 μm, such as about 11 μm. Finally, the third redistribution layer 513 may be formed so that it extends towards the pulled back edge of the fourth redistribution passivation layer 515 a tenth distance $D_{10}$ of between about 1 μm and about 50 μm, such as about 10 μm, and extends towards the active circuitry region 807 of the fourth redistribution passivation layer 515 an eleventh distance $D_{11}$ of between about 1 μm and about 50 μm, such as about 7 μm.

Once the redistribution structure 500 has been formed with the step back structure within the scribe region 804, additional manufacturing processes may be performed. For example, the first carrier substrate 101 may be debonded, the polymer layer 105 may be patterned, the first package 700 may be bonded to the vias 111, and the structure may be singulated using, e.g., a laser singulation process, as described above with respect to FIGS. 1-7B.

However, by utilizing the open scribe line approach as described herein, the removal of the passivation layers from the scribe line regions saves money during the singulation process. For example, in an embodiment in which a laser is utilized to perform the singulation, by removing material in the scribe region 804 prior to the singulation process, there is already less material that needs to be removed. As such, with less material to remove, less power is needed during the actual singulation process to remove the material that remains in place. As such, the increased adhesion that is available with a material such as the low temperature cured polyimide material allows for such a step back and is more feasible to be used with the scribe line open approach.

Additionally, while not explicitly described herein, the dimensions used to form the seal ring 806 may also be used in the embodiments described above with respect to FIGS. 1-7. For example, the dimensions used to form the seal ring 806 may be used within the structures that do not have the step back of the passivation layers.

By utilizing the hybrid and full low temperature cured polyimide structures as described herein, the adhesion of the passivation layers can be improved. Such adhesion can improve the delamination free rate of these structures from about 86% to about 100%, effectively mitigating or even eliminating problems associated with delamination within these structures.

Figure 9:
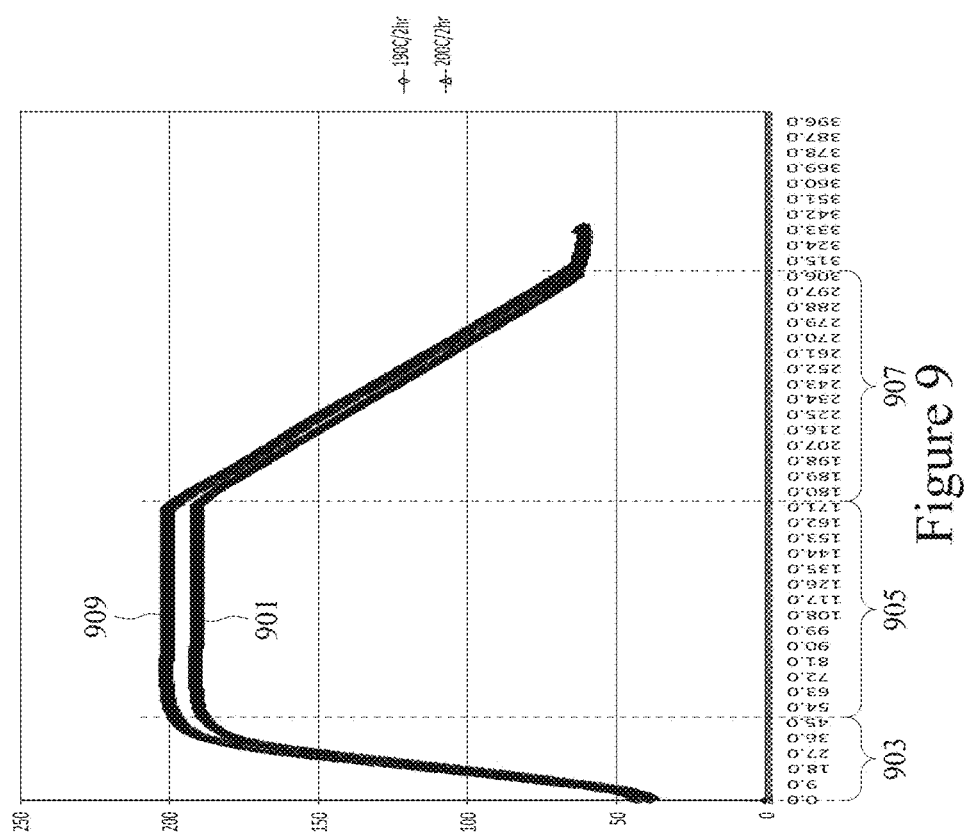
FIG. 9 illustrates a first embodiment of an ultra-low temperature curing process in accordance with some embodiments.

FIG. 9 illustrates another embodiment in which the material of the second redistribution passivation layer 507, instead of being cured to form a low temperature cured polyimide (as described above with respect to FIGS. 1-8B), is cured to form an ultra-low temperature cured polyimide. In this embodiment, and as FIG. 9 illustrates with the x-axis units being in minutes, the second redistribution passivation layer 507 may be cured using a first curing process 901 which has a first ramping stage 903, a first curing stage 905, and a first cooling stage 907. In an embodiment the first curing process 901 is performed with a radiation curing process, wherein the second redistribution passivation layer 507 is irradiated with energy in order to increase the temperature of the second redistribution passivation layer 507. However, any suitable heating process may be utilized.

In an embodiment the first curing process 901 may be initiated by raising the temperature of the second redistribution passivation layer 507 from room temperature to a temperature of between about 150° C. and less than or equal to about 200° C., such as about 190° C. in the first ramping stage 903. In an embodiment the first ramping stage 903 may increase the temperature of the second redistribution passivation layer 507 at a rate of between about 2° C./min and about 5° C., such as about 4.8° C., and can bypass the need for a low temperature step to warm up the machine. However, any suitable rate of temperature change may be utilized.

Once the first ramping stage 903 has increased the temperature to the desired curing temperature (e.g., 190° C.), the temperature of the second redistribution passivation layer 507 may be held steady for the first curing stage 905. In an embodiment the first curing stage 905 may be between about 1 hour and about 10 hours, such as about 2 hours. However, any suitable time may be utilized.

After the first curing stage 905 has been completed, the first cooling stage 907 may be used to lower the temperature of the second redistribution passivation layer 507 for further processing. In an embodiment the first cooling stage 907 may reduce the temperature of the second redistribution passivation layer 507 at a rate of between about 0.5° C./min and about 2.0° C./min, such as about 1.0° C./min or about 0.8° C./min. However, any suitable rate of cooling may be utilized.

During each of the first ramping stage 903, the first curing stage 905, and the first cooling stage 907, a non-reactive gas such as nitrogen may be flowed through the chamber at a flow rate of between about 10000 sccm and about 90000 sccm, such as about 60000 sccm. Additionally, an oxygen content of the atmosphere may be kept to below about 5 ppm. The pressure of the chamber may also be kept at a pressure of between about 30 torr and about 700 torr, such as at about 69 torr. However, any suitable process conditions may be utilized.

FIG. 9 also illustrates another embodiment in which the second redistribution passivation layer 507 is cured using a second curing process 909. In this embodiment, the first ramping stage 903 may be performed as described above with respect to the first curing process 901 (e.g. ramping at a rate of about 1.0° C./min). However, in this embodiment the first ramping stage 903 continues to increase the temperature of the second redistribution passivation layer 507 until the temperature of the second redistribution passivation layer 507 has increased to about 200° C. The temperature of the second redistribution passivation layer 507 is held at 200° C. for between about 1 hour and about 10 hours, such as about 2 hours, and then the first cooling stage 907 may be used to reduce the temperature of the second redistribution passivation layer 507 for further processing.

Figure 10:
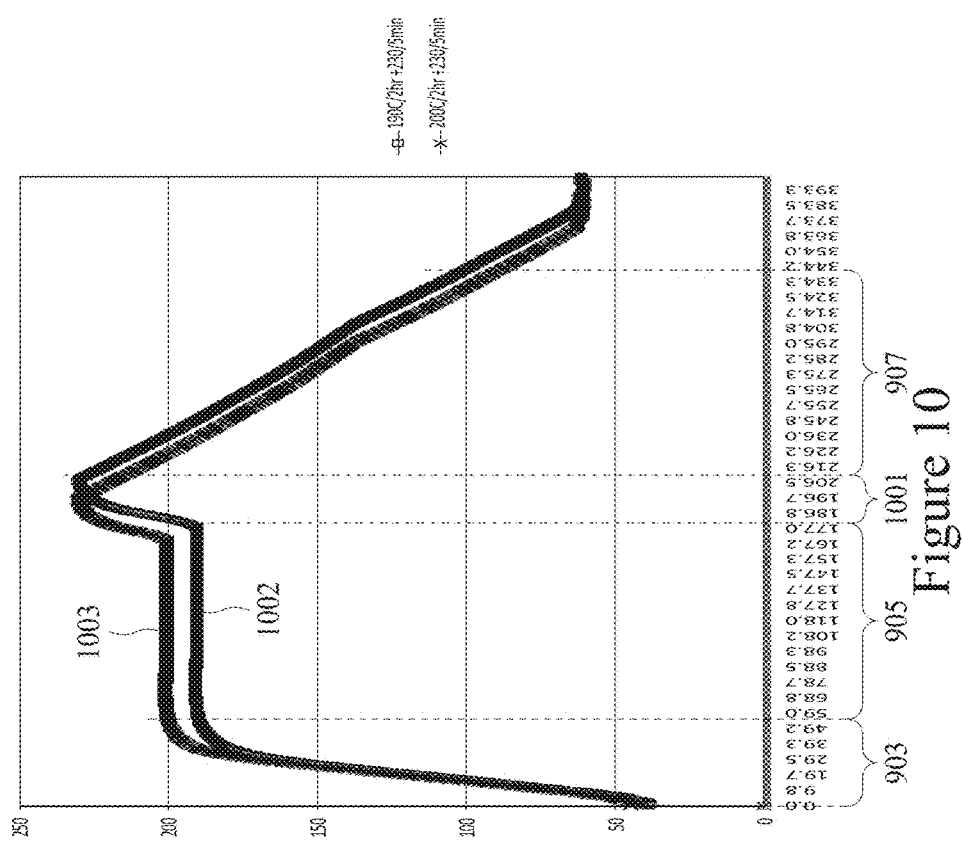
FIG. 10 illustrates a second embodiment of an ultra-low temperature curing process in accordance with some embodiments.

FIG. 10 illustrates another embodiment in which a spike stage 1001 is used in addition to the first ramping stage 903, the first curing stage 905, and the first cooling stage 907. In one embodiment, a third curing process 1002 is illustrated in which, at the end of the first curing stage 905 with a temperature of 190° C., the temperature of the second redistribution passivation layer 507 is increased to a temperature of between about 200° C. and about 260° C., such as about 230° C. In an embodiment the temperature in the spike stage 1001 may be increased at a rate of between about 1.8° C./min and about 10° C./min, such as about 2° C./min. Once the temperature has increased to the maximum temperature, the first cooling stage 907 may be utilized to reduce the temperature of the second redistribution passivation layer 507 for further processing as described above with respect to FIG. 9.

FIG. 10 also illustrates a fourth curing process 1003 which also uses the spike stage 1001, and in which the x-axis has units of minutes. In this embodiment, however, instead of the first curing stage 905 holding a temperature of 190° C., the first curing stage 905 holds a temperature of about 200° C. Then, once the first curing stage 905 has been completed, the spike stage 1001 may be used to increase the temperature of the second redistribution passivation layer 507 to a temperature of between about 200° C. and about 260° C., such as about 230° C., and then the first cooling stage 907 may be used to reduce the temperature of the second redistribution passivation layer 507 for further processing.

Figure 11:
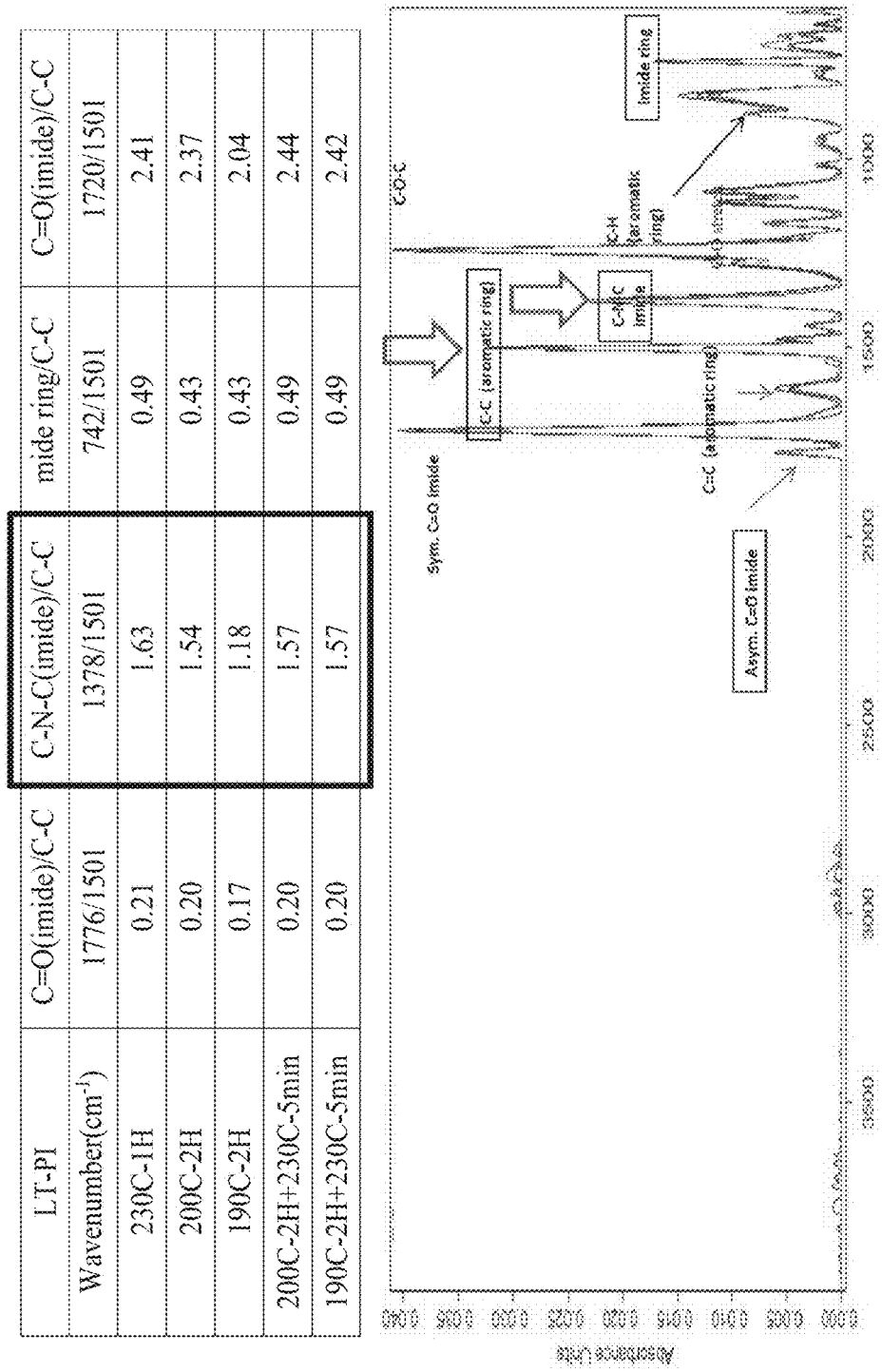
FIG. 11 illustrates test data of materials formed using an ultra-low temperature curing process in accordance with some embodiments.

FIG. 11 illustrates additional test data taken which illustrates the polyimide cyclization using a 1378 cm$^{-1}$/1501 cm$^{-1}$ Fourier transform infrared spectroscopy (FTIR) ratio. In particular, the ultra-low temperature cured polyimide as described herein (represented in FIG. 11 by the rows labeled "200C-2H," "190C-2H," "200C-2H+230C-5 min," and "190C-2H+230C-5 min") has an polyimide cyclization of less than 1.60, whereas other polyimides (such as the non ultra-low temperature polyimide labeled in FIG. 11 as "230C-1H") have a polyimide cyclization of greater than 1.6, such as 1.63. As such, the ultra-low temperature cured polyimide may provide additional structural benefits for the second redistribution passivation layer 507.

For example, if the second redistribution passivation layer 507 is formed as a low-temperature polyimide material (instead of an ultra-low temperature polyimide material), such as by being cured at a temperature of 230° C. for one hour, the second redistribution passivation layer 507 may be formed with an initial thickness of 11.91 μm, but have a thickness after curing of only 8.38 μm, which has a 70% shrinkage and warps by 63 μm. Additionally, outgassing at a temperature of 130° C. for five minutes has a pressure of 4.67×10$^{-8}$ torr, and the film has an elongation of 87.2%/

1.56%, a tensile strength of 198/4.09 MPa, and a cyclization of 100%. Finally, the film has an adhesion using a stud pull of a coarse copper of >600 kg/cm2 at an epoxy interface, an adhesion of 643.6/42.8 kg/cm2 when an MR10X+TCC200 test is used, and an adhesion of 629.6/49.8 kg/cm2 when an MR3X+µHAST96 adhesion test is utilized.

However, if the second redistribution passivation layer 507 is formed as an ultra-low temperature polyimide material, such as by being cured at a temperature of 190° C. for two hours, the second redistribution passivation layer 507 may be formed with an initial thickness of 11.96 µm, but have a thickness after curing of only 8.48 µm, which has a 71% shrinkage and warps by 67 µm. Additionally, outgassing at a temperature of 130° C. for five minutes has a pressure of $5.04 \times 10^{-8}$ torr, and the film has an elongation of 52.2%/4.39%, a tensile strength of 131/3.4 MPa, and a cyclization of 85%. Finally, the film has an adhesion on coarse copper surfaces using stud pull tests of >600 kg/cm2 at an epoxy interface, an adhesion of 619.3/91.2 kg/cm2 when an MR10X+TCC200 test is used, and an adhesion of 535.4/28.9 kg/cm2 when an MR3X+µHAST96 adhesion test is utilized. Finally, the second redistribution passivation layer 507 has a real wafer of WLFT (wafer level final test) yield of 92.5%.

Additionally, if the second redistribution passivation layer 507 is formed as an ultra-low temperature polyimide material of another embodiment, such as by being cured at a temperature of 200° C. for two hours, the second redistribution passivation layer 507 may be formed with an initial thickness of 11.96 µm, but have a thickness after curing of only 8.46 µm, which has a 71% shrinkage and warps by 60 µm. Additionally, outgassing at a temperature of 130° C. for five minutes has a pressure of $5.65 \times 10^{-8}$ torr, and the film has an elongation of 71.6%/1.12%, a tensile strength of 149/4.19 MPa, and a cyclization of 98%. Finally, the film has an adhesion on coarse copper surfaces using stud pull tests >600 kg/cm2 at an epoxy interface, an adhesion of 580.8/43.2 kg/cm2 when an MR10X+TCC200 test is used, and an adhesion of 487.4/65.6 kg/cm2 when an MR3X+µHAST96 adhesion test is utilized. Finally, the second redistribution passivation layer 507 has a real wafer of WLFT (wafer level final test) yield of 95.4%.

By forming the second redistribution passivation layer 507 as an ultra-low temperature cured polyimide material, a thermal budget for the overall manufacture may be greatly reduced. Additionally, in embodiments in which the first semiconductor device 201 is a DRAM device, which may be very susceptible to damage from heating, the DRAM/ memory failure rate may be reduced from 4% (in an embodiment using a DRAM device with a high thermal budget) to as low as 0%, which may lead to a wafer per hour improvement from 10 to 16 for additional cost reductions.

Additionally, the ultra-low temperature cured polyimide material may be substituted for any of the low-temperature cured polyimide materials as described above with respect to FIGS. 1-8B. For example, the ultra-low temperature cured polyimide material may be used for the first redistribution passivation layer 501, for the third redistribution passivation layer 511, for the fourth redistribution passivation layer 515, or for the polymer layer 105 in any of the combinations as described above with respect to FIGS. 1-8B. Any suitable combination may be utilized.

Figure 12:
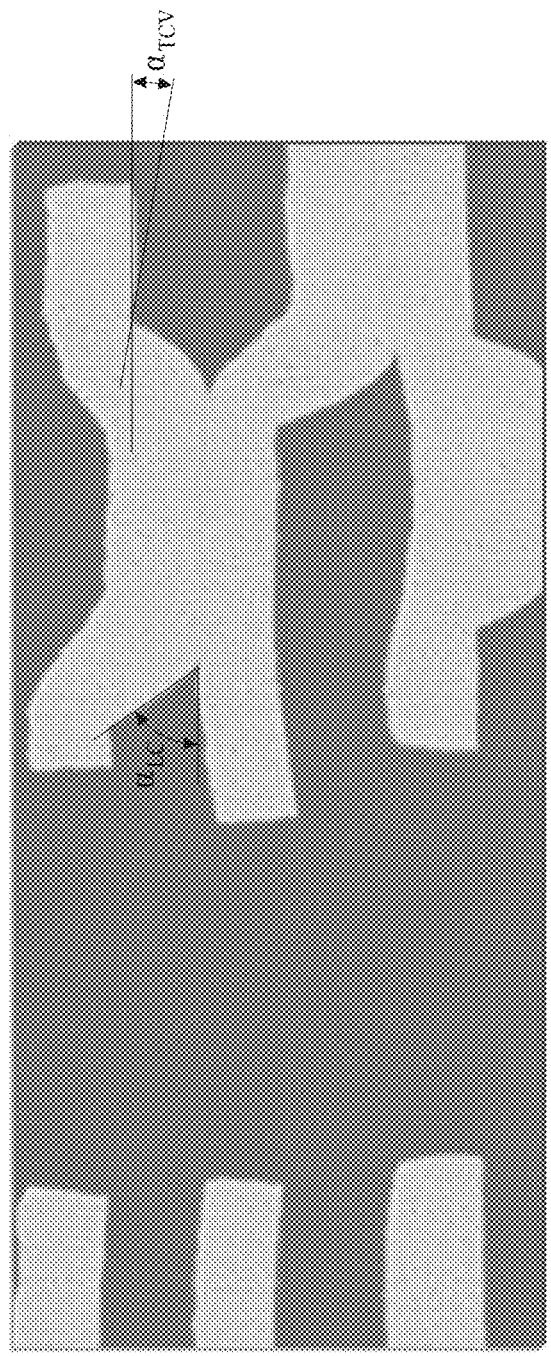
FIG. 12 illustrates structural effects of using an ultra-low temperature curing process in accordance with some embodiments.

FIG. 12 illustrates that, when the ultra-low temperature cured polyimide material is used for the first redistribution passivation layer 501, for the third redistribution passivation layer 511, and for the fourth redistribution passivation layer 515, the structure of the openings formed through the first redistribution passivation layer 501, the third redistribution passivation layer 511, and the fourth redistribution passivation layer 515 is improved. For example, when the ultra-low temperature cured polyimide material is used for the first redistribution passivation layer 501, for the third redistribution passivation layer 511, and for the fourth redistribution passivation layer 515, the openings through these layers may be formed to have a top corner via opening $\alpha_{TCV}$ of between about 2° and about 8° (as opposed to 10°-15° for a low temperature cured polyimide material. Additionally, the opening may have a lower corner angle $\alpha_{LC}$ of between about 45° and about 55°.

Finally, by using the low temperature cured polyimide material for the materials of the first redistribution passivation layer 501, the second redistribution passivation layer 507, the third redistribution passivation layer 511, and the fourth redistribution passivation layer 515, and/or the polymer layer 105, the degree of planarization (DoP) for each layer may be improved. In particular, the DoP is determined by the following equation, where t is the thickness of the underlying layers and is is the height of a bump or imperfection in the redistribution passivation layer caused by the underlying layers:

$$DoP = \left(1 - \frac{ts}{t}\right) \times 100\%.$$

Experimental data indicates that the DoP is improved from 48.6% (1-138 µm/3.5 µm for a low temperature cured polyimide material) to 68.6% (1-1.1 µm/3.5 µm for an ultra-low temperature cured polyimide material). In other words, the surface of the passivation layers is significantly flatter using an ultra-low temperature cured polyimide material.

In accordance with an embodiment, a method of manufacturing a semiconductor device, the method comprising placing a first semiconductor die adjacent to a via and encapsulating the first semiconductor die and the via with an encapsulant is provided. A first dielectric layer is formed over the first semiconductor die and the via, and a first redistribution layer is formed over the first dielectric layer. A second dielectric layer is deposited over the first redistribution layer, wherein the second dielectric layer comprises a first material, the first material being a low-temperature cured polyimide.

In accordance with another embodiment, a method of manufacturing a semiconductor device, the method comprising applying a first dielectric material over a via, a first semiconductor device, and an encapsulant, wherein the via is laterally separated from the first semiconductor device by the encapsulant is provided. A first application of a polyimide is performed, wherein the performing the first application further comprises a first set of steps, the first set of steps comprises applying a second dielectric material over the first dielectric material, wherein the second dielectric material comprises a polyimide resin, photoactive compounds, and a solvent; exposing the second dielectric material to a patterned light source; developing the second dielectric material after the exposing the second dielectric material; and curing the second dielectric material after the developing the second dielectric material, wherein the curing the second dielectric material is performed at a temperature of less than 230° C.

In accordance with yet another embodiment, a semiconductor device comprising an encapsulant extending between a first semiconductor die and a via, wherein the encapsulant, the first semiconductor die and the via are planar with each other is provided. A first dielectric is located over the encapsulant. A first redistribution layer is located over the first dielectric, the first redistribution layer comprising a first material. A second dielectric is located over the first redistribution layer, wherein the second dielectric has an adhesion to the first material of greater than about 680 kg/cm².

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   placing a first semiconductor die adjacent to a via;
   encapsulating the first semiconductor die and the via with an encapsulant;
   forming a first dielectric layer over the first semiconductor die and the via;
   forming a first redistribution layer over the first dielectric layer; and
   depositing a second dielectric layer over the first redistribution layer, wherein the second dielectric layer comprises a first material, the first material being a low-temperature cured polyimide that has been cured at a temperature of less than about 230° C. and for a time of between about 1 hour and about 2 hours, wherein a sidewall of the second dielectric layer is offset from a sidewall of the first dielectric layer by greater than 8 μm, wherein the curing comprises:
     a ramping stage, wherein the ramping stage increases the temperature of the second dielectric material at a rate of about 2° C./min and about 4.8° C./min;
     a curing stage wherein the second dielectric material is cured at a temperature of about 190° C. for about two hours; and
     a cooling stage, wherein the cooling stage decreases the temperature of the second dielectric material at a rate of about 0.5° C./min and about 2.0° C./min.

2. The method of claim 1, wherein the first dielectric layer comprises the first material.

3. The method of claim 1, wherein the first semiconductor die comprises a third dielectric layer between a semiconductor substrate and the first redistribution layer, the third dielectric layer comprising the first material.

4. The method of claim 1, further comprising a third dielectric layer located on an opposite side of the first semiconductor die than the first dielectric layer, the third dielectric layer comprising the first material.

5. The method of claim 1, further comprising a third dielectric layer located on an opposite side of the first semiconductor die than the first dielectric layer, the third dielectric layer comprising a second material, the second material being polybenzoxazole.

6. The method of claim 1, further comprising a plurality of dielectric layers over the second dielectric layer, wherein each one of the plurality of dielectric layers comprises the first material.

7. The method of claim 1, further comprising:
   a plurality of dielectric layers over the second dielectric layer, wherein each one of the plurality of dielectric layers comprises the first material;
   a third dielectric layer between a semiconductor substrate of the first semiconductor die and the first redistribution layer, the third dielectric layer comprising the first material; and
   a fourth dielectric layer located on an opposite side of the first semiconductor die than the first dielectric layer, the fourth dielectric layer comprising the first material.

8. The method of claim 1, wherein the sidewall of the second dielectric layer is offset from the sidewall of the first dielectric layer by less than 50 μm.

9. The method of claim 1, wherein the second dielectric layer has an adhesion to the first dielectric layer of greater than about 680 kg/cm².

10. A method of manufacturing a semiconductor device, the method comprising:
    applying a first dielectric material over a via, a first semiconductor device, and an encapsulant, wherein the via is laterally separated from the first semiconductor device by the encapsulant;
    performing a first application of a polyimide, wherein the performing the first application further comprises a first set of steps, the first set of steps comprising:
      applying a second dielectric material over the first dielectric material, wherein the second dielectric material comprises a polyimide resin, photoactive compounds, and a solvent;
      exposing the second dielectric material to a patterned light source;
      developing the second dielectric material after the exposing the second dielectric material;
      curing the second dielectric material after the developing the second dielectric material, wherein the curing the second dielectric material is performed at a temperature of less than 230 C, wherein the curing the second dielectric material further comprises:
        a ramping stage, wherein the ramping stage increases the temperature of the second dielectric material at a rate of about 2° C./min and about 4.8° C./min;
        a curing stage wherein the second dielectric material is cured at a temperature of about 200° C. for about two hours; and
        a cooling stage, wherein the cooling stage decreases the temperature of the second dielectric material at a rate of about 0.5° C./min and about 2.0° C./min; and
    performing a second application of a polyimide after the first application, wherein the second application comprises the first set of steps, wherein the developing step of the second application forms an exterior sidewall that has a lateral offset from an exterior sidewall of the second dielectric material applied during the first application, wherein the lateral offset is at least 8 μm.

11. The method of claim 10, further comprising performing a third application of a polyimide after the second application, wherein the third application comprises the first set of steps.

12. The method of claim 10, wherein the applying the first dielectric material comprises the first set of steps.

13. The method of claim 12, wherein the first semiconductor device comprises a low-temperature polyimide.

14. The method of claim 10, wherein the curing the second dielectric material further comprises a spike stage after the curing stage, wherein the spike stage increases the temperature of the second dielectric material to greater than 200° C.

15. The method of claim 10, wherein the second dielectric material has an adhesion to the first dielectric material of greater than about 680 kg/cm$^2$.

16. A method of manufacturing a semiconductor device, the method comprising:
placing an encapsulant between a first semiconductor die and a via;
planarizing the encapsulant, the first semiconductor die and the via until the encapsulant, the first semiconductor die, and the via are planar with each other;
placing a first dielectric over the encapsulant;
forming a first redistribution layer over the first dielectric, the first redistribution layer comprising a first material; and
forming a second dielectric located over the first redistribution layer, wherein the second dielectric has an adhesion to the first material of greater than about 680 kg/cm$^2$, wherein the forming the second dielectric comprises curing the second dielectric, the curing comprising:
a ramping stage, wherein the ramping stage increases the temperature of the second dielectric material at a rate of about 2° C./min and about 4.8° C./min;
a curing stage wherein the second dielectric material is cured at a temperature of about 200° C. for about two hours; and
a cooling stage, wherein the cooling stage decreases the temperature of the second dielectric material at a rate of about 0.5° C./min and about 2.0° C./min.

17. The method of claim 16, further comprising:
forming a second redistribution layer over the second dielectric, the second redistribution layer comprising a second material; and
forming a third dielectric over the second redistribution layer, wherein the third dielectric has an adhesion to the second material of greater than about 680 kg/cm$^2$.

18. The method of claim 17, further comprising:
forming a third redistribution layer over the third dielectric, the third redistribution layer comprising a third material; and
forming a fourth dielectric over the third redistribution layer, wherein the fourth dielectric has an adhesion to the third material of greater than about 680 kg/cm$^2$.

19. The method of claim 18, further comprising forming a fifth dielectric located on an opposite side of the first semiconductor die than the first dielectric, wherein the fifth dielectric and the second dielectric comprise the same material.

20. The method of claim 19, wherein the first semiconductor die further comprises a sixth dielectric surrounding external contacts, wherein the sixth dielectric and the second dielectric comprise the same material.

21. The method of claim 18, wherein the first dielectric, the second dielectric, and the third dielectric form a step pattern.

22. The method of claim 16, wherein the second dielectric layer has an exterior sidewall that has a lateral offset from an exterior sidewall of the first dielectric layer.

23. The method of claim 22, wherein the lateral offset is greater than about 8 μm.

24. The method of claim 23, wherein the lateral offset is less than about 50 μm.

* * * * *

UNITED STATES PATENT AND TRADEMARK OFFICE
CERTIFICATE OF CORRECTION

| | | |
|---|---|---|
| PATENT NO. | : 10,304,700 B2 | Page 1 of 1 |
| APPLICATION NO. | : 15/170487 | |
| DATED | : May 28, 2019 | |
| INVENTOR(S) | : Zi-Jheng Liu et al. | |

It is certified that error appears in the above-identified patent and that said Letters Patent is hereby corrected as shown below:

On the Title Page

Item (72) Inventors, Line 3, delete "Shih-Hao Liao" and insert --Sih-Hao Liao--.

Signed and Sealed this
Tenth Day of September, 2019

Andrei Iancu
*Director of the United States Patent and Trademark Office*